(12) United States Patent
Yamashita et al.

(10) Patent No.: US 6,433,588 B1
(45) Date of Patent: *Aug. 13, 2002

(54) LOGIC CIRCUIT INCLUDING COMBINED PASS TRANSISTOR AND CMOS CIRCUITS AND A METHOD OF SYNTHESIZING THE LOGIC CIRCUIT

(75) Inventors: Shunzo Yamashita, Tokorozawa; Kazuo Yano, Hino, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/940,597

(22) Filed: Aug. 29, 2001

Related U.S. Application Data

(63) Continuation of application No. 09/331,780, filed on Jun. 24, 1999, now Pat. No. 6,313,666, which is a continuation-in-part of application No. PCT/JP96/01104, filed on Apr. 24, 1996, which is a continuation-in-part of application No. 08/633,053, filed on Apr. 16, 1996, now Pat. No. 5,923,189.

(30) Foreign Application Priority Data

Jan. 7, 1997 (JP) .............................................. 9-000548

(51) Int. Cl.$^7$ ............................................. H03K 19/094
(52) U.S. Cl. ...................... 326/113; 326/114; 326/112; 326/121
(58) Field of Search ................................. 326/113, 121, 326/83, 114, 112; 327/407, 408

(56) References Cited

U.S. PATENT DOCUMENTS 5,572,151 A * 11/1996 Hanawa et al. ............. 326/113
6,259,276 B1 * 7/2001 Sasaki et al. ................ 326/112

FOREIGN PATENT DOCUMENTS

| JP | 1-129611 | 5/1989 |
| JP | 1-216622 | 8/1989 |
| JP | 1-256219 | 10/1989 |
| JP | 7-130856 | 5/1995 |
| JP | 7-168874 | 7/1995 |
| JP | 9-6821 | 1/1997 |

OTHER PUBLICATIONS

Yano et al., "Lean Integration: Achieving a Quantum Leap in Performance and Cost of Logic LSIs", IEEE 1994 Custom Integrated Circuits Conference, pp. 603–606.

Sasaki et al., "Multi–Level Pass–Transistor Logic for Low–Power ULSIs", IEEE Symposium on Low Power Electronics, 1995, pp. 14–15.

Lee et al., "A New Low–Power Circuit Technology based on Pass–Transistor Logic", Japanese Institute of Electronics, Information & Communication Engineers, technica report, VLD 95–115, vol. 95, No. 119, pp. 1–6.

* cited by examiner

*Primary Examiner*—Huan Hoang
(74) *Attorney, Agent, or Firm*—Antonelli, Terry, Stout & Kraus, LLP

(57) ABSTRACT

In order to produce a logic circuit excellent in circuit characteristics which are area, delay time and power consumption by combining pass transistor logic circuits and CMOS logic circuits, a binary decision diagram is created from a Boolean function, and respective nodes of the diagram are mapped into 2-input, 1-output, 1-control input pass transistor selectors to synthesize a pass transistor logic circuit. In the pass transistor logic circuit, a pass transistor selector operating as a NAND or NOR logic with any one of its two inputs excluding the control input being fixed to a logical constant "1" or "0" is replaced with a CMOS gate operating as a NAND or NOR logic logically equivalent to the pass transistor selector if the value of a predetermined circuit characteristic obtained by the replacement is closer to an optimal value (if the resulting logic circuit is smaller in area, delay time or power consumption than the original pass transistor logic circuit).

9 Claims, 16 Drawing Sheets

FIG. 4A
| | PASS TRANSISTOR | CMOS |
|---|---|---|
| NAND | C1, OUT, A, B<br>172 μm² 0.95ns<br>15.9 μW/MHz | OUT A B = VDD, A, OUT, B, C2<br>129 μm² 0.31ns<br>40.0 μW/MHz |
| NOR | C3, OUT, A, VDD, B<br>172 μm² 0.95ns<br>15.9 μW/MHz | OUT A B = A, B, VDD, C4, OUT<br>129 μm² 0.48ns<br>30.0 μW/MHz |
FIG. 4B
INVERTER
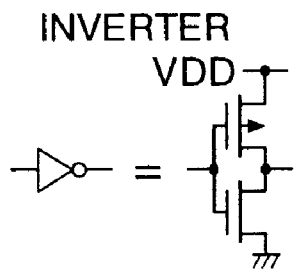
FIG. 4C
BUFFER INVERTER
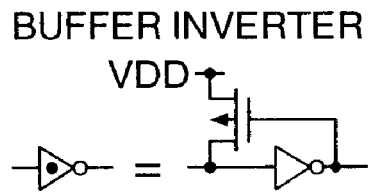

FIG. 5

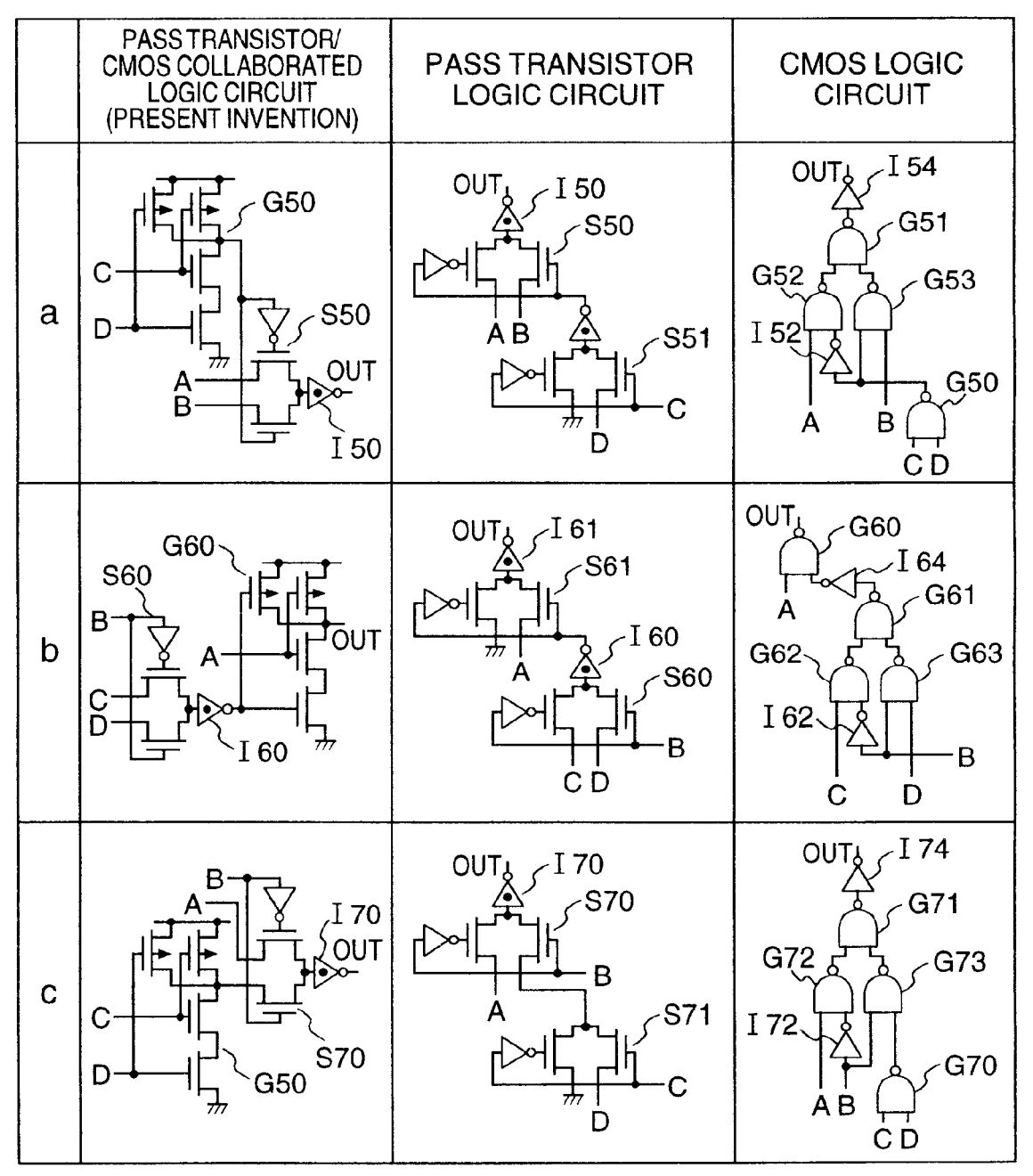

| | PASS TRANSISTOR/ CMOS COLLABORATED LOGIC CIRCUIT (PRESENT INVENTION) | PASS TRANSISTOR LOGIC CIRCUIT | CMOS LOGIC CIRCUIT |
|---|---|---|---|
| a | | | |
| b | | | |
| c | | | |

——— BRANCH "1"
-------- BRANCH "0"
[1] NODE REPRESENTING LOGICAL CONSTANT "1"
[0] NODE REPRESENTING LOGICAL CONSTANT "0"

2-INPUT NAND GATE

2-INPUT NOR GATE

INVERTER

LOGIC CIRCUIT INCLUDING COMBINED PASS TRANSISTOR AND CMOS CIRCUITS AND A METHOD OF SYNTHESIZING THE LOGIC CIRCUIT

CROSS-REFERENCE TO RELATED APPLICATIONS

This application is a continuation of U.S. application Ser. No. 09/331,780, filed on Jun. 24, 1999, now U.S. Pat. No. 6,313,666, which is a continuation-in-part of international patent application No. PCT/JP96/1104, filed Apr. 24, 1996, the disclosure of which is incorporated in its entirety herein by reference. The international patent application No. PCT/JP96/1104 is, in turn, which is a continuation-in-part of earlier U.S. Ser. No. 08/633,053, filed Apr. 16, 1996, now U.S. Pat. No. 5,923,189, the disclosure of which is incorporated in its entirety herein by reference and earlier U.S. Ser. No. 08/633,486, filed Apr. 17, 1996.

TECHNICAL FIELD

The present invention relates to a small-area, high-speed, low power consumption logic circuit which includes combined pass transistor and CMOS circuits, and also to a method of synthesizing from a Boolean function a small-area, high-speed, low power consumption logic circuit which includes combined pass transistor and CMOS circuits.

BACKGROUND ART

In a pass transistor logic circuit as one of logic circuits, a single transistor may have various logical functions. Thus, many researches are published which aim to fabricate pass transistor logic circuits well and replace all the conventional CMOS logic circuits with the pass logic circuits to obtain an LSI, while greatly reducing the number of transistors of the LSI to reduce its area and power consumption.

One of the researches discloses a method of synthesizing a pass transistor logic circuit having an intended logical faculty by replacing a respective one of nodes of a binary decision diagram produced from a Boolean function with a 2-input, 1-output, 1-control input pass transistor selector.

The binary decision diagram is a graphic representation of a Boolean function with a binary tree of nodes having two branches called branches "1" and "0". It is capable of expressing a complicated Boolean function concisely. Thus, this is watched as a method of synthesizing a Compact pass transistor logic circuit which has an intended logical function with fewer transistors than the conventional transistor logic circuit.

For example, Proceeding of IEEE 1994 Custom Integrated Circuits Conference, pp. 603–606 (hereinafter referred to as "document 1") proposes a method of synthesizing a desired pass transistor logic circuit by fabricating a 2-input, 1-output pass transistor selector with n-channel field effect transistors alone, and inserting buffer inverters to reduce a delay time as requested.

The conventional CMOS logic circuit requires as many low-performance p-channel field effect transistors as n-channel field effect transistors. However, the great part of the pass transistor logic circuit synthesized by the method described in the document 1 can be composed of higher-performance n-channel field effect transistors alone excluding buffer inverters. Thus, a high-performance circuit is obtained which is reduced in area, delay time and power consumption compared to the conventional CMOS logic circuit.

IEEE Symposium on Low Power Electronics, 1995, pp. 14–15 (hereinafter referred to as "document 2") proposes a method which includes further development of the method of document 1. The method of document 2 is characterized in that a pass transistor logic circuit is synthesized on the basis of multi-level binary decision diagram, which is produced in the following process:

(1-1) A binary decision diagram is created from a Boolean function; and (1-2) Partial trees which have different nodes indicated by a branch "0" or "1", but which are exactly the same in graphic shape (the same-type partial trees) are extracted, and nodes controlled by the same-type partial tree are newly produced.

By beneficial effects of (1-2), a Boolean function is expressed with fewer nodes than a regular binary decision diagram in the multi-stage binary decision diagram. Thus, a pass transistor logic circuit having an intended logical function can be synthesized with fewer transistors than those described in document 1. Since the number of nodes connected in series is suppressed so that the number of stages of the synthesized pass transistor circuits is suppressed as well. Thus, a pass transistor logic circuit reduced in delay time, area and power consumption compared to that of document 1 can be synthesized.

Japanese Institute of Electronics, Information and Communication Engineers, technical report VLD 95–115, Vol. 95, No. 119, pp. 1–6 (hereinafter referred to as "document 3") proposes a method of synthesizing a pass transistor logic circuit reduced in power consumption. In this method, like document 2, a pass transistor logic circuit is synthesized based on the multi-stage binary decision diagram. By using a minimum number of delay time improving buffer inverters, a pass transistor logic circuit of further reduced power consumption is synthesized.

JP-A-1-129611, JP-A-1-216622, JP-A-1-256219 and JP-A-7-130856 describe pass transistor circuits.

Furthermore, JP-A-7-168874 and JP-A-9-6821 describe a method of synthesizing a pass transistor logic circuit.

DISCLOSURE OF THE INVENTION

The inventors actually created binary decision graphs based on several Boolean functions and synthesized pass transistor logic circuits using the methods described in the documents 1, 2 and 3. As a result, for a certain Boolean function, a pass transistor logic circuit was successfully synthesized which was reduced greatly in the number of transistors, area, delay time and power consumption compared to the conventional CMOS logic circuits. However, for another Boolean function, we found that a pass logic circuit obtained conversely increased in area, delay time, and power consumption.

For example, when a simple 2-input NAND logic is synthesized with a pass transistor logic circuit, using each of the methods of the documents 1, 2 and 3, the logic circuit obtained is composed of six transistors shown by C1 in FIG. 4A. However, when it is synthesized with a CMOS logic circuit, the logic circuit obtained is a simplified circuit (C2 of FIG. 4A) composed of four transistors. When a 2-input NOR logic is synthesized with a pass transistor logic circuit, the resulting circuit contains six transistors (C3 of FIG. 4A), while when it is synthesized with a CMOS logic circuit, the resulting circuit contains four transistors (C4 of FIG. 4A).

As shown in FIGS. 4A–4C, for NAND logic and NOR logic, a circuit composed of CMOS gates has better performance with reference to area and delay time excluding power consumption than that composed of a pass transistor logic circuit. As just described above, the pass transistor selector circuit is not suitable for the NAND or NOR logic, but suitable for a selector logic which selects one of signals using another signal because of its circuit composition. The NAND/NOR logic is a basic circuit of the CMOS circuit, so that it is natural that the CMOS circuit can fabricate a higher-performance logic circuit than the pass transistor circuit. However, even in NAND and NOR logics, the pass transistor circuit is lower in power consumption than the CMOS circuit.

This point is overlooked in the researches of the conventional pass transistor circuits, which indicates that the pass transistor circuit and CMOS circuits have their strongest and weakest points and that the pass transistor circuits are not always superior to the CMOS circuits in every respect. Which of the pass transistor circuits and the CMOS circuits is superior to the other varies depending on a preferentially handled one of area, delay time and power consumption as the circuit characteristic of a logic circuit to be synthesized.

Unlike the age in which the logic circuits were designed by peopleÕs hands, logic circuits are designed, using a high-class language such as HDL (Hardware Description Language) at present. Thus, it is very important how a logic Composed of combined If-Then-Else (corresponding to a selector logic) and Boolean algebra is realized, using a compact logic circuit.

As described above, for any logic, or when any one of area, delay time and power consumption as the circuit characteristics takes preference over the others characteristics, a logic circuit having excellent circuit characteristics cannot be composed only of pass transistor circuits. Thus, a pass transistor/CMOS collaborated logic circuit is required to be produced which includes a well combination of advantages of pass transistor circuits and CMOS circuits so that the pass transistor circuits and CMOS circuits cooperate well with each other. In order to produce an excellent-performance LSI chip reduced in area, delay time, and power consumption, it has a very important significance to provide a method of automatically synthesizing in a computer system a pass transistor/CMOS collaborated logic circuit having such excellent performance.

When a pass transistor logic circuit was synthesized on the basis of a multi-level binary decision diagram, using the method described in the document 2, the number of transistors used was further reduced. However, some delay times conversely increased depending on logics employed. Our original analysis of those time delays clarified the existence of the following problem. A pass transistor logic circuit synthesized on the basis of its multi-level binary decision diagram includes a circuit in which a particular pass transistor selector is connected via a buffer inverter to a control input of a subsequent pass transistor selector. In this case, we found that a buffer inverter was connected in series with an inverter of the subsequent pass transistor selector, so that the delay time would increase inevitably. When the requirements of the delay time were strict, we found that the method of synthesizing the pass transistor logic circuit on the basis of the multi-level binary decision diagram was unpractical as the case may be because the delay time was a bottleneck.

It is an object of the present invention to provide a pass transistor/CMOS collaborated logic circuit more excellent in circuit characteristic which is area, delay time or power consumption than a logic circuit composed only of conventional pass transistors or CMOS transistors, and a method of automatically synthesizing such pass transistor/CMOS collaborated logic circuit in a computer system.

Another object of the present invention is to provide a pass transistor/CMOS collaborated logic circuit composed of a reduced number of transistors and reduced in delay time, and excellent in circuit characteristic which is area, delay time or power consumption, and a method of synthesizing such pass transistor/CMOS collaborated logic circuit, by solving the problem of the delay time with the conventional logic circuits synthesized only with pass transistors on the basis of the Conventional multi-level binary decision diagram.

A further object of the present invention is to provide a method of synthesizing a logic circuit preferable in circuit characteristic which is area, delay time or power consumption or their combinations, by combining pass transistor circuits and CMOS circuits well.

In order to achieve the above objects, according to a desired aspect of the present invention, there is provided a logic circuit including a selector logic with a Boolean processing function, comprising:

a first p-channel field effect transistor (TP1) having a gate which is controlled by a first input (IN1) thereto, and a source-drain path which is connected across a first operating potential (VDD) and a first node (NP1);

a second p-channel field effect transistor (TP3) having a gate which is controlled by a second input (IN2) thereto, and a source-drain path which is connected across the first operating potential (VDD) and the first node (NP1);

a first n-channel field effect transistor (TN1) having a gate which is controlled by the first input (IN1) thereto, and a source-drain path which is connected across the first node (NP1) and a fourth node (NP4);

a second n-channel field effect transistor (TN1) having a gate which is controlled by a second input (IN2) thereto, and a source-drain path which is connected across the fourth node (NP4) and a second operating potential (GND);

a third p-channel field effect transistor (TP3) having a gate which is controlled by the first node (NP1), and a source-drain path which is connected across the first operating potential (VDD) and a second node (NP2);

a third n-channel field effect transistor (TN3) having a gate which is controlled by the first noae (NP1), and a source-drain path which is connected across the second node (NP2) and the second operating potential (GND);

a fifth n-channel field effect transistor (TN5) having a gate which is controlled by the second node (NP2), and a source-drain path which is connected across a third input (IN3) thereto and the third node (NP3);

a sixth n-channel field effect transistor (TN6) having a gate which is controlled by the first node (NP1), and a source-drain path which is connected across a fourth input (IN4) and the third node (NP3);

a fourth p-channel field effect transistor (TP4) having a gate which is controlled by the third node (NP3), and a source-drain path which is connected across the first operating potential (VDD) and a first output (OUT1); and a fourth n-channel field effect transistor (TN4) having a gate which is controlled by the third node (NP3), and a source-drain path which is connected across the first first output (OUT1) and the second operating potential (GND) (FIG. 1).

According to another desired aspect, there is provided a logic circuit including a selector logic with a Boolean processing function, comprising:

a tenth p-channel field effect transistor (TP10) having a gate which is controlled by a tenth input (IN10) thereto, and a source-drain path which is connected across a first operating potential (VDD) and a tenth node (NP10);

a tenth n-channel field effect transistor (TN10) having a gate which is controlled by the tenth input (IN10), and a source-drain path which is connected across the tenth node (NP10) and the second operating potential (GND);

an eleventh n-channel field effect transistor (TN11) having a gate which is controlled by the tenth node (NP10), and a source-drain path being connected across an eleventh input (IN11) thereto and an eleventh node (NP11);

a twelfth n-channel field effect transistor (TN12) having a gate being controlled by the tenth input (IN10), and a source-drain path being connected across a twelfth input (IN12) and the eleventh node (NP11);

a fifteenth p-channel field effect transistor (TP15) having a gate which is controlled by the eleventh node (NP11), and a source-drain path which is connected across the first operating potential (VDD) and a twelfth node (NP12);

a fifteenth n-channel field effect transistor (NP15) having a gate which is controlled by the eleventh node (NP11), and a source-drain path which is connected across the twelfth node (NP12) and the second operating potential (GND);

a fourteenth p-channel field effect transistor (TP14) having a gate which is controlled by the twelfth node (NP12), and a source-drain path which is connected across the first operating potential (VDD) and a tenth output (OUT10);

a fourteenth n-channel field effect transistor (TN14) having gate which is controlled by the twelfth node (NP12), and a source-drain path which is connected across the tenth output (OUT10) and a thirteenth node (NP13);

a thirteenth p-channel field effect transistor (TP13) having a gate which is controlled by a thirteenth input (IN13) thereto, and a source-drain path which is connected across the first operating potential (VDD) and the tenth output (OUT10); and a thirteenth n-channel field effect transistor (TN13) having a gate which is controlled by the thirteenth input (IN13), and a source-drain path which is connected across the tenth output (OUT10) and the second operating potential (GND) (FIG. 2).

According to still another desired aspect of the present invention, there is provided a logic circuit including a selector logic with a Boolean processing function, comprising:

a twentieth p-channel field effect transistor (TP20) having a gate which is controlled by a twentieth input (IN20) thereto, and a source-drain path being connected across a first operating potential (VDD) and a twentieth node (NP20);

a twenty-first p-channel field effect transistor (TP21) having a gate which is controlled by a twenty first input (IN21) thereto, and a source-drain path which is connected across the first operating potential (VDD) and the twentieth node (NP20);

a twentieth n-channel field effect transistor (TN20) having a gate which is controlled by the twentieth input (IN20), and a source-drain path which is connected across the twentieth node (NP20) and a twenty-fourth node (NP24);

a twenty-first n-channel field effect transistor (TN21) having a gate which is controlled by the twenty-first input (IN21), and a source-drain path which is connected across the twenty-fourth node (NP24) and a second operating potential (GND);

a twenty-second p-channel field effect transistor (TP22) having a gate which is controlled by a twenty-second input (IN22) thereto, and a source-drain path which is connected across the first operating potential (VDD) and a twenty-second node (NP22);

a twenty-second n-channel field effect transistor (TN22) having a gate which is controlled by the twenty-second input (IN22), and a source-drain path which is connected across the twenty-second node (NP22) and the second operating potential (GND);

a twenty-third n-channel field effect transistor (TN23) having a gate which is controlled by the twenty-second node (IN22), and a source-drain path being connected across a twenty-third input (IN23) thereto and a twenty-third node (NP23);

a twenty-fourth n-channel field effect transistor (TN24) having gate which is controlled by the twenty-second input (IN22), and a source-drain path which is connected across the twentieth node (NP20) and the twenty-third node (NP23);

a twenty-fifth p-channel field effect transistor (TP25) having a gate which is controlled by the twenty-third node (NP23), and a source-drain path which is connected across the first operating potential (VDD) and a twentieth output (OUT20); and a twenty-fifth n-channel field effect transistor (TN25) having a gate which is controlled by the twenty-third node (NP23), and a source-drain path which is connected across the twentieth output (OUT20) and the second operating potential (GND) (FIG. 3).

In order to synthesize, in a computer system, such logic circuit which includes combined pass transistor and CMOS logic circuits, in the present invention, a binary decision diagram or a multi-level decision diagram is created from a Boolean function. All nodes of the diagram are mapped into 2-input, 1-output, 1-control input pass transistor selectors to produce a pass transistor logic circuit. In the pass transistor logic circuit, a pass transistor selector operating as a NAND or NOR (or AND or OR) logic with any one of its two inputs being fixed to a logic constant "1" or "0" is replaced with a CMOS gate operating as a NAND or NOR (or AND or OR) logic logically equivalent to the pass transistor selector if a calculated value of the area, delay time or power consumption as a predetermined circuit characteristic of a circuit resulting from the replacement is closer to an optimal value. The above processes are performed on all other pass transistor selectors to thereby synthesize a pass transistor/CMOS collaborated logic circuit whose predetermined circuit characteristic is optimal. As the circuit characteristics used for such optimization, there are, for example, area, delay time or power consumption, or a combination of two or three of them.

According to another desired aspect of the present invention, a binary decision diagram or a multi-level binary decision diagram is created from a Boolean function. Nodes of the diagram, having a pair of branches "0" and "1" only any one of which branches is fixed to a logical constant "1" or "0", are mapped by CMOS gates equivalent in NAND or NOR (or AND or OR) logic to those nodes, and other nodes are mapped by corresponding pass transistor selector circuits having a two-input and one-output to thereby synthesize a pass transistor/CMOS collaborated logic circuit.

BRIEF DESCRIPTION OF THE DRAWINGS

FIGS. 4A–4C show in comparison NAND and NOR logics each composed of pass transistor selectors and NAND and NOR logics each composed of CMOS gates;

FIG. 5 shows in comparison pass transistor/CMOS transistor collaborated logic circuits as an embodiment 1 of the present invention and the conventional pass transistor logic circuits and CMOS logic circuits;

BEST MODE FOR CARRYING OUT THE INVENTION

Figure 1:
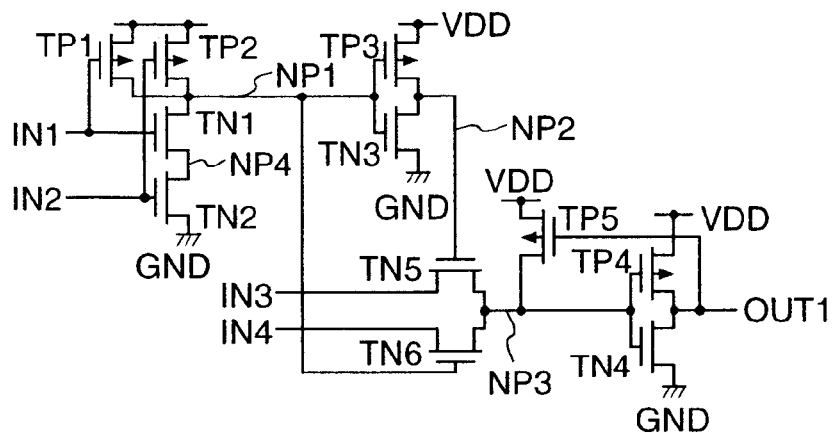
FIG. 1 shows a preferred embodiment of the present invention.
Figure 2:
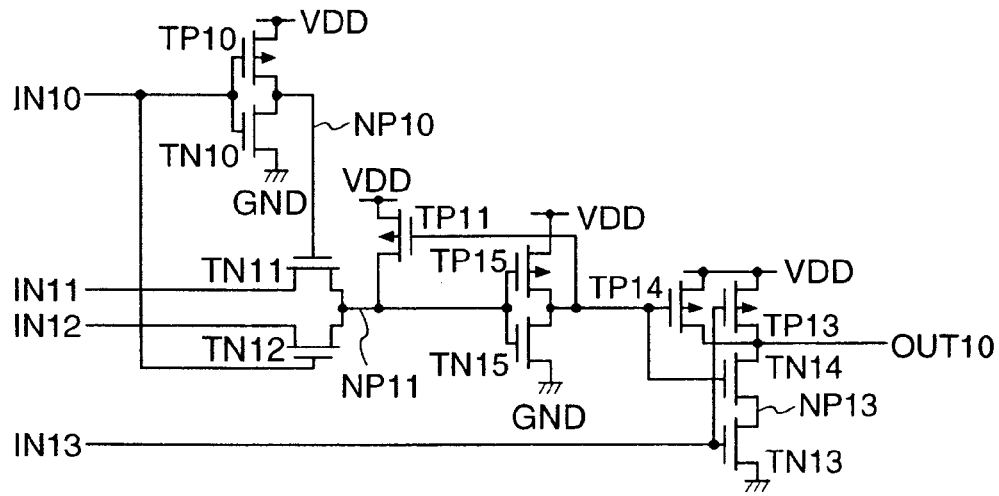
FIG. 2 shows another preferred embodiment of the present invention.
Figure 3:
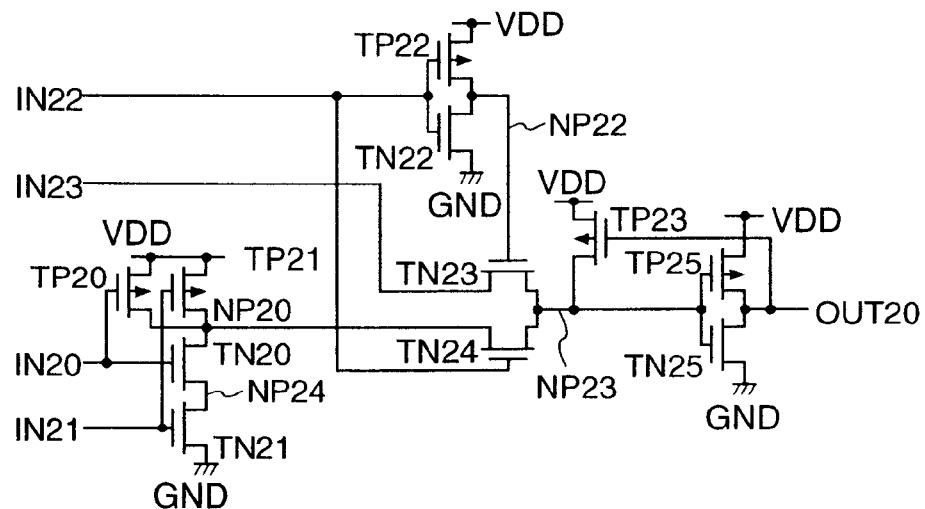
FIG. 3 shows still another preferred embodiment of the present invention.

A pass transistor logic circuit/CMOS collaborated logic circuit and its synthesizing method according to the present invention will be described in more detail with respect to several embodiments thereof shown in the drawings. In the following, the same reference numeral represents the same or similar element.

Embodiment 1

An embodiment of the inventive pass transistor logic circuit/CMOS collaborated logic circuit will be described with respect to FIG. 5. Item letters a, b and c in FIG. 5 represent logics given by Boolean functions which will be described below and realized by an inventive pass transistor/CMOS transistor collaborated logic circuit, a conventional pass transistor logic circuit and a conventional CMOS logic circuit, for comparing purposes. The inverters and CMOS gates shown in simplified symbols in FIG. 5 include the transistor circuits of FIG. 4.

In FIG. 5, $a\ out = (B*(C*D) + A*C*D)$ $b\ out = (A*(B*D + B*C))$ $c\ out = (B*(C*D) + B*A)$ In a of FIG. 5, the inventive pass transistor/ CMOS transistor collaborated logic circuit is composed of an inverter I50, a pass transistor selector S50, and a CMOS gate 50. The conventional pass transistor logic circuit requires inverters I50, I51 and pass transistor selector S50, S51. The CMOS logic circuit requires inverters I52, I54 and CMOS gates G50–G53. As shown in a of FIG. 5, the conventional pass transistor logic circuit requires to incorporate therein a NAND or NOR logic which is not suitable therefor (S51). In the conventional CMOS logic circuit, a selector logic is required to be composed of CMOS circuit which is not suitable for composing the selector logic (G51–G53).

In contrast, in the inventive pass transistor/CMOS collaborated logic circuit, a circuit portion corresponding to a selector logic of a given logic can be composed of a pass transistor selector (S50) suitable for the selector logic and circuit portions corresponding to other NAND and NOR logic circuits can be composed of CMOS gates (G50) suitable for the NAND and NOR logics. That is, the inventive pass transistor/CMOS collaborated logic circuit is a compact logic circuit which realizes a combination of selector and a NAND or NOR (AND or OR) logic. Thus, it will be seen that the inventive pass transistor/CMOS collaborated logic circuit is a high-performance (small area, low power consumption) one which realizes a desired logical function with 11 transistors whereas the pass transistor logic circuit requires 14 transistors and the CMOS logic circuit requires 20 transistors.

In addition, in the inventive pass transistor/CMOS collaborated logic circuit, circuit portions corresponding to the selector S51 and the inverter I51 of the pass transistor logic circuit are collected into a single small CMOS gate G50, so that the delay time required for a signal to travel through an inverter of the selector S51, the selector S51, and a buffer inverter I51 is reduced to the delay time required for the signal to pass through the CMOS gate G50 alone.

In addition, since an inverter having a large delay time in the selector S51 of the pass transistor logic circuit is removed from a relevant route, the inventive pass transistor/CMOS collaborated logic circuit has a greatly reduced delay time compared to the pass transistor logic circuit. In addition, a circuit portion of the inventive pass transistor/CMOS collaborated logic circuit corresponding to a route portion including G51–G53, I52 and I54 of the CMOS logic circuit is S50 and SI50. Thus, the inventive pass transistor/CMOS collaborated logic circuit has a smaller delay time than the CMOS logic circuit.

Figure 6:
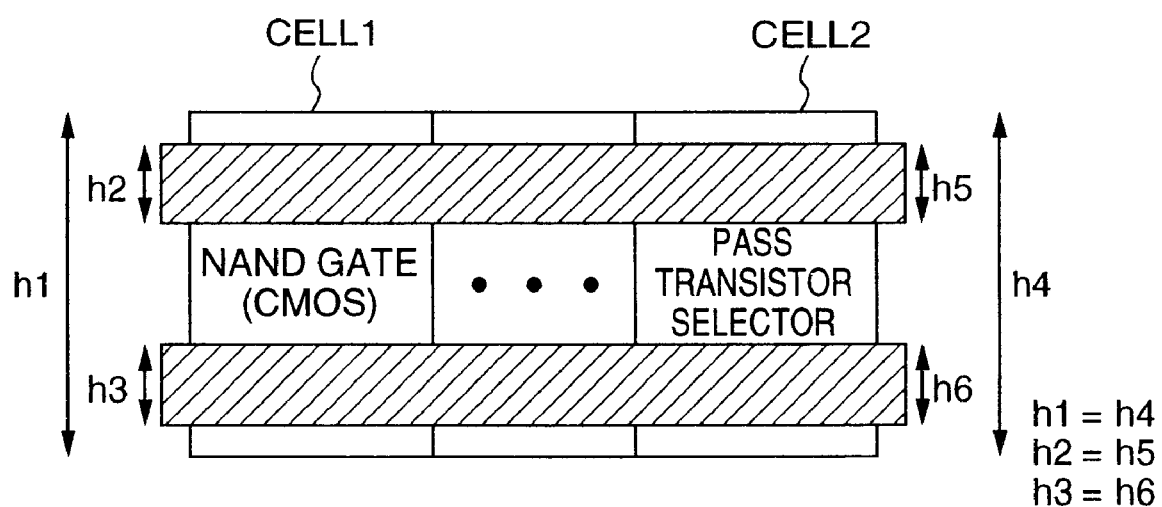
FIG. 6 illustrates a layout of the pass transistor/CMOS collaborated logic circuit as the embodiment 1 of the present invention.

FIG. 6 illustrates the layout of the inventive pass transistor/CMOS collaborated logic circuit shown by a in FIG. 5. In FIG. 6, a cell 1 corresponds to the NAND gate (G50) of the CMOS circuit, and a cell 2 corresponds to the pass transistor selector (S50). As shown in FIG. 6, until the heights h1 and h4 of the cells 1 and 2, respectively, the widths h2 and h3 of power supply lines (VDD and GND) of the cell 1, and the widths h5 and h6 of power supply lines (VDD and GND) of the cell 2 are made equal, a logic circuit into which the pass transistor circuit and the CMOS circuit are combined is not actually manufactured, which applies in other subsequent embodiments.

For the logic shown by b in FIG. 5, in order to realize the inter tended logical function, the inventive pass transistor/CMOS collaborated logic circuit only requires an inverter I60, a pass transistor selector S60 and a CMOS gate G60 which are formed with eleven transistors, while the pass transistor logic circuit requires inverters I60 and I61 and pass transistor selectors S60, S61 which are formed with fourteen transistors, and the CMOS logic circuit requires inverters I62, I64 and CMOS gates G60–G63 which are formed with twenty transistors. Also, in this case, it will be seen that the inventive pass transistor/CMOS collaborated logic circuit has the best performance. For the delay time, in the inventive pass transistor/CMOS collaborated logic circuit, circuit portions corresponding to the selector S61 and the inverter I61 are collected into a single small CMOS gate G60. Thus, the delay time required for a signal to travel through the inverter of the selector S61, the selector S61, and the buffer inverter I61 in the pass transistor logic circuit is reduced to the delay time required for the signal to travel through the CMOS gate G50 alone. Especially, since the inverter of the selector S61 having a large delay time is removed, the inventive pass transistor/CMOS collaborated logic circuit has a greatly reduced delay time compared to the pass transistor logic circuit. In addition, a circuit portion of the inventive pass transistor/CMOS collaborated logic circuit corresponding to a route portion including G61–G63, I62 and I64 of the CMOS logic circuit is S60 and SI60. Thus, the inventive pass transistor/CMOS collaborated logic circuit has a smaller delay time than the CMOS logic circuit.

For the logic shown by c in FIG. 5, in order to realize the intended logical function, the inventive pass transistor/CMOS collaborated logic circuit only requires an inverter I70, a pass transistor selector S70 and a CMOS gate G70 which are formed with eleven transistors, while the pass transistor logic circuit requires inverters I70 and I71, and pass transistor selectors S70, S71 which are formed with fourteen transistors, and the CMOS logic circuit requires inverters I72, I74 and CMOS gates G70–G73 which are formed with twenty transistors. Also, in this case, it will be seen that the inventive pass transistor/CMOS collaborated logic circuit has the best performance. For the delay time, the inventive pass transistor/CMOS collaborated logic circuit has the smallest delay time on the same reason as described with respect to a and b of FIG. 5.

Embodiment 2

In the above embodiment, the inventive pass transistor/CMOS collaborated logic circuits were illustrated, using the simple logics as an example. In the present embodiment, a method of automatically synthesizing a pass transistor/CMOS collaborated logic circuit having excellent circuit characteristics which are area, delay time, power consumption, etc. for more complicated logics, using a computer system of FIGS. 7 and 8, will be described.

Figure 8:
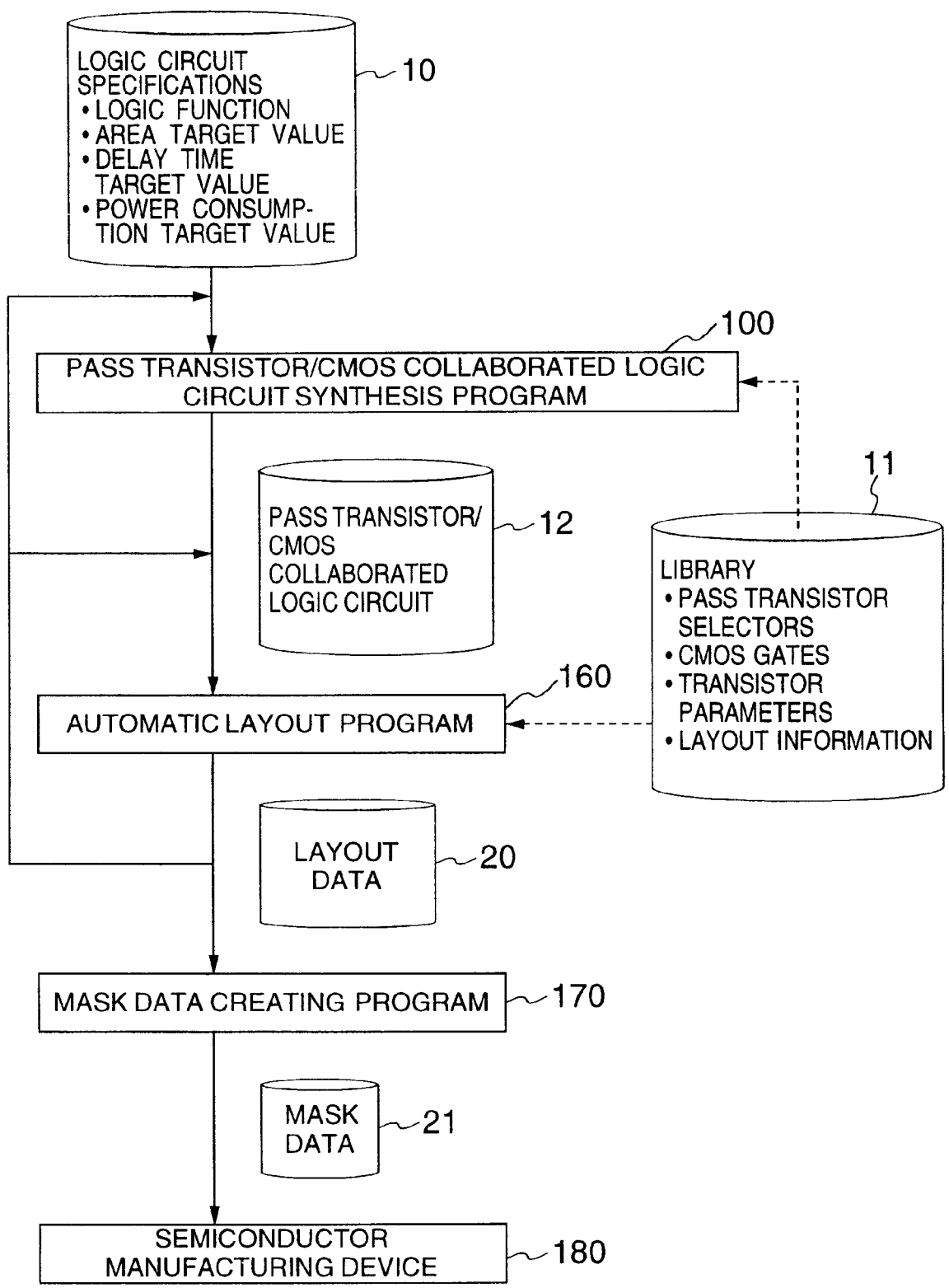
FIG. 8 is a flow chart of logic circuit synthesis-semiconductor integrated circuit manufacture, as the embodiment 2.

(1) Whole Composition of the System:

In FIG. 8, the designer enters logic circuit specifications 10 which describe the specifications of the logical function of a desired semiconductor integrated circuit. The logic circuit specifications 10 describe a Boolean function which describes the logical function of the circuit. In addition, they describe target values for circuit characteristics which are the area, delay time and power consumption of the circuit, and information on a circuit characteristic to which the highest priority should be given. A pass transistor/CMOS collaborated logic circuit synthesis program 100 special to the present embodiment synthesizes a pass transistor/CMOS collaborated logic circuit 12 having the logical function of the logic circuit specifications 10 so as to satisfy the target values for circuit characteristics which are the area, delay time, power consumption, etc. of the circuit by referring to a library 11 from information described in the logic circuit specifications 10. An automatic layout program 160 refers to the library 11 to determine a layout optimal to the logic circuit, and creates layout data 20. A mask data creating program 170 determines a plurality of mask patterns to produce the synthesized logic circuit, using semiconductor integrated circuit techniques in accordance with the layout data 20, and produces mask data 21 representing those mask patterns. A semiconductor manufacturing device 180 manufactures a semiconductor integrated circuit having intended logical functions, using the mask data 21. The programs 100, 160 and 170 are executed on respective different computers allocated thereto. Of course, those programs are executable on the same computer.

Figure 7:
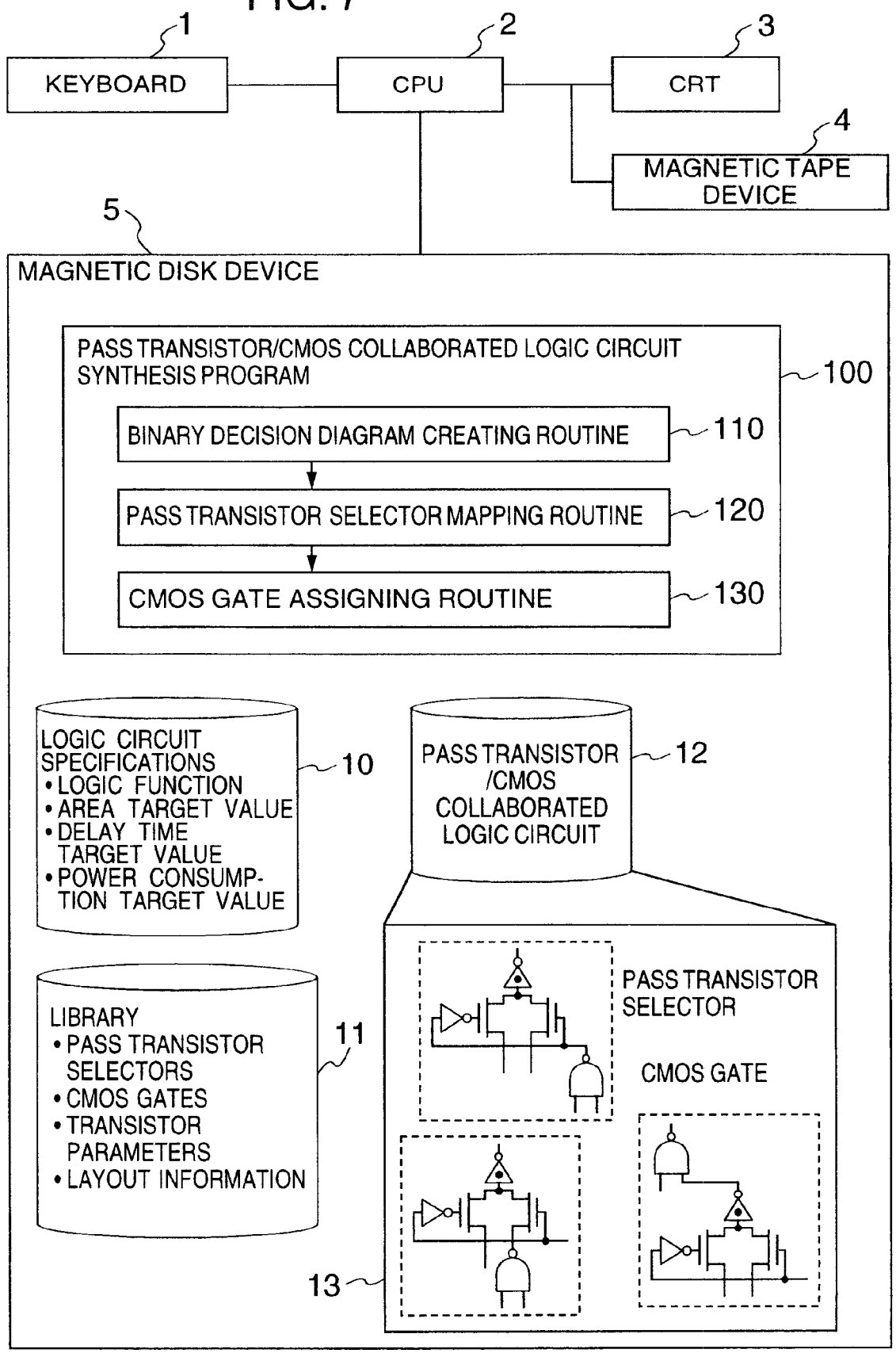
FIG. 7 shows a schematic combined composition of a computer system for synthesizing a logic circuit and a logic circuit synthesis program used in the computer system, as an embodiment 2 of the present invention.

FIG. 7 shows a schematic composition of the inventive pass transistor/CMOS collaborated logic circuit synthesis program 100 and a computer system for executing the program 100. The computer system is provided with an input device such as, for example, a keyboard 1, a central processing unit (CPU) 2, a display unit (CRT) 3, a magnetic tape device 4, and a magnetic disk device 5 which contains the logic circuit synthesis program 100, which is composed of a binary decision diagram creating routine 110, a pass transistor selector mapping routine 120, and a CMOS gate assigning routine 130. When the designer enters required instructions via the keyboard 1, the program is loaded from the magnetic disk device 5 on the CPU 2 and then executed. The pass transistor/CMOS collaborated logic circuit 12 synthesized by the program 100 is displayed on the CRT 3 and then transferred via the magnetic tape device 4, etc., to the automatic layout program 160 of FIG. 8.

The present embodiment is featured in that in the pass transistor circuit synthesized by mapping a pass transistor selector on the basis of a created binary decision diagram, parts of the pass transistor circuit which will have improved performance if they are converted to respective CMOS circuits are found, and replaced with the respective CMOS circuits to synthesize a pass transistor/CMOS collaborated logic circuit excellent in performance than the conventional logic circuits composed only of pass transistors or CMOS field effect transistors. More specifically, a pass transistor selector which operates in a NAND or NOR (or AND or OR) logic with one of its two inputs being fixed to a logical constant "1" or "0" is replaced with a logically equivalent CMOS gate such as NAND or NOR (or AND or OR) logic. The values of its circuit characteristics which are area, delay time and power consumption are calculated. As a result, if it is obvious that the replacement of the pass transistor selector with the CMOS gate causes the value of its predetermined circuit characteristic to further approach an optimal value, the pass transistor selector is replaced with the CMOS gate to thereby replace appropriate circuit portions of the pass transistor circuit with the CMOS circuits for performance improvement. The respective routines used in the present embodiment will be described below, using the following Boolean functions as an example:

Out 1=B*A+C*A+(I*F+D)*(D+(H+E)*(E+G))

Out 2=B+((I*F+D)*(D+(H+E)*(E+G)))

Figure 10:
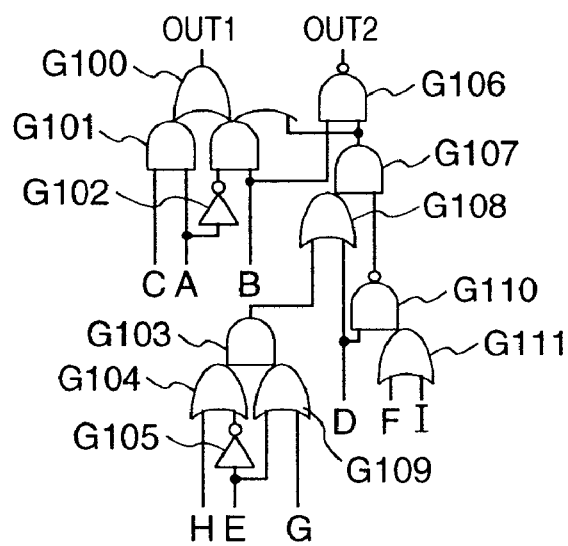
FIG. 10 is a circuit diagram of a CMOS logic circuit synthesized from a Boolean function of the embodiment 2, using the conventional method.

A CMOS logic circuit composed of G100–G111 of FIG. 10 will be synthesized on the basis of the above Boolean function, if the conventional method is employed.

(2) Binary Decision Diagram Creating Routine 110:

This routine 110 creates a binary decision diagram from logic circuit specifications 10, which contains an input and an output variable corresponding to an input and an output signal, respectively, of the logic circuit to be synthesized, and a Boolean function which represents the logical function of the circuit.

Figure 11:
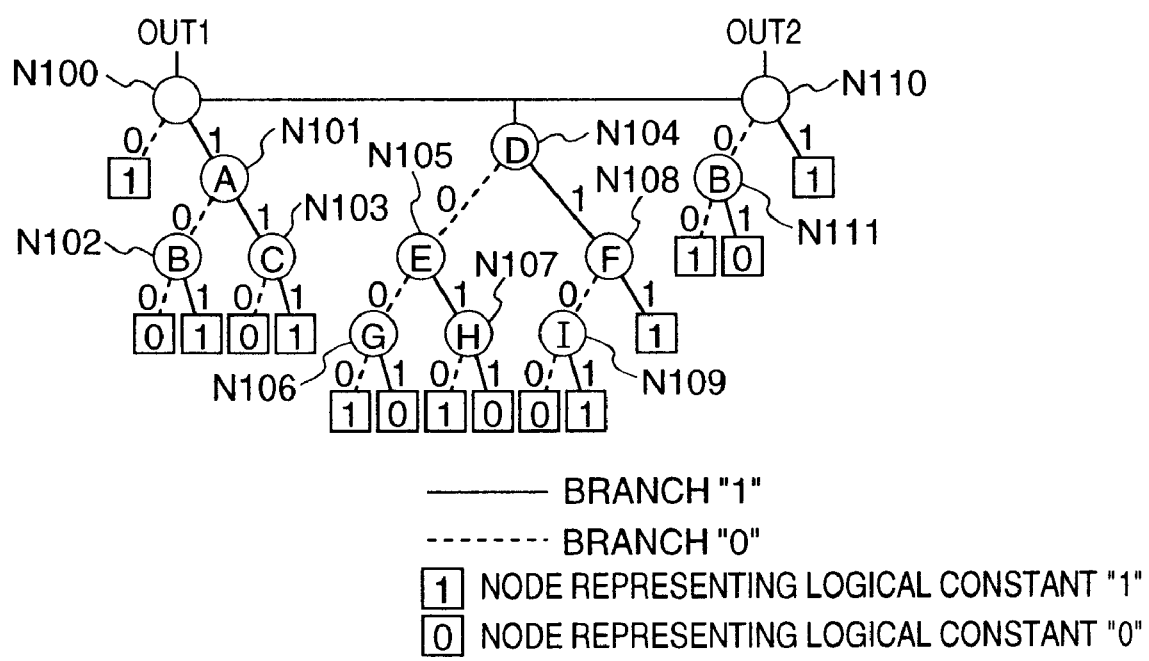
FIG. 11 illustrates a multi-level binary decision diagram produced in a binary decision diagram creation routine of the pass transistor/CMOS collaborated logic circuit synthesis program of FIG. 9 according to the present invention.

From the above Boolean functions, a multi-level tree binary decision diagram is created which includes nodes N100–N111. In this multi-level binary decision diagram of FIG. 11, the nodes N104–N109 are commonized and bundled off to form a multi-level tree to reduce the number of nodes compared to a regular binary decision diagram. In order to create a small-sized binary decision diagram having fewer nodes, the order of input variables has very important significance in the diagram creating process. It is determinable, using a conventional well-known binary decision diagram creating tool.

(3) Pass Transistor Selector Mapping Routine 120

Figure 12:
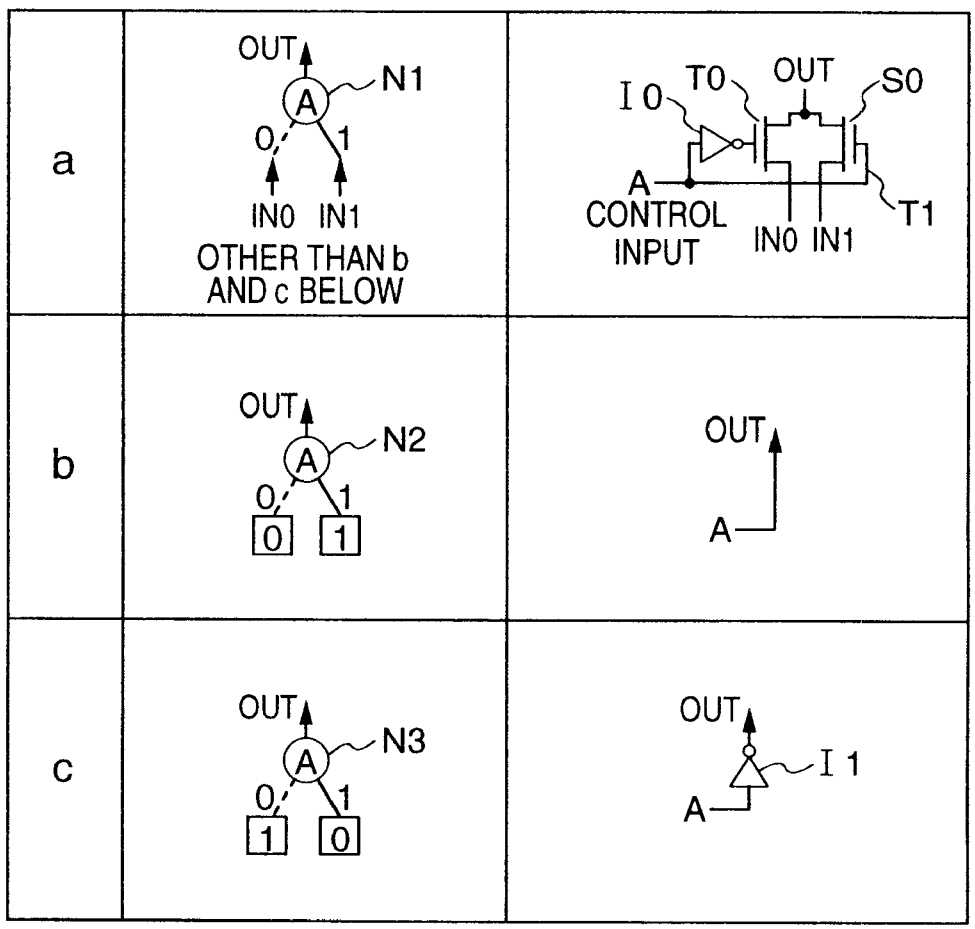
FIG. 12 shows a mapping rule for a pass transistor selector.

This routine maps the respective nodes of a binary decision diagram created in the binary decision diagram creating routine 110 in accordance with mapping rules of FIG. 12 into pass transistor selectors, inverters or the like depending on the respective types of the nodes to produce a pass transistor logic circuit. In addition, buffer inverters are inserted as requested.

If logical constants to which branches "1" and "0" are connected are not "1" and "0", respectively, like a node N1 shown by a in FIG. 12, this corresponds to a 2-input 1-output pass transistor selector S0 composed of n-channel field effect transistors T0, T1 and an inverter I0. An input variable A corresponding to a node of a binary decision diagram is assigned to the control input of the pass transistor selector S0, a node output connected to a branch "1" is assigned to an input in1 selected when the control input is "1", and a node output connected to a branch "0" is assigned to an input in0 selected when the control input is "0".

If branches "1" and "0" are connected to logical constants "1" and "0", respectively, as in a node N2 shown by b in FIG. 12, the node outputs "0" when the input variable A of the node is "1", and the node outputs "1" when the input variable A of the node is "0". That is, the input signal A as it is is required to be connected to the subsequent circuit.

If branches "1" and "0" are connected to logical constants "1" and "0", respectively, as in a node N3 shown by c in FIG. 12, the node outputs "0" when the input variable A of the node is "1", and the node outputs "1" when the input variable A of the node is "0". That is, the input signal A is required to be inverted by an inverter and then connected to the subsequent circuit.

By such mapping, a pass transistor logic circuit is synthesized which has the same logical function as the binary decision diagram. When a pass transistor logic circuit is synthesized from the binary decision diagram of FIG. 11, the resulting pass transistor logic circuit includes pass transistor selectors S100–S105, and inverters I100–I105. In this circuit, the inverters I100, I103 and I105 are buffer inverters. In the binary decision diagram of FIG. 11, nodes N102, N103 and N109 correspond to the mapping rule b of FIG. 12, and nodes N106, N107 and N111 correspond to the mapping rule c of FIG. 12. Other nodes correspond to the mapping rule a in FIG. 12.

(4) CMOS Gate Assigning Routine 130

In this routine, when it is considered that the replacement of pass transistor selectors, operating as NAND and/or NOR (or AND and/or OR) logics in the pass transistor logic circuit produced in the pass transistor selector mapping routine 120, with CMOS gates will improve the circuit characteristics of the logic circuit which are its area, delay time and power consumption, the pass transistor selectors are replaced with the CMOS gates.

Figure 14B:
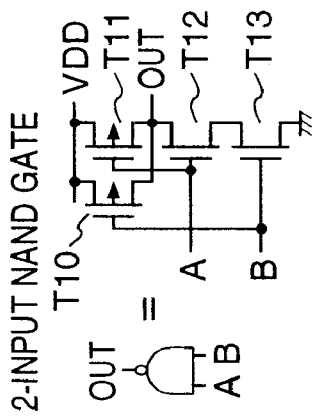
FIGS. 14A–14D illustrate a pattern of a pass transistor selector converted to a CMOS gate and its conversion rules when the pass transistor/CMOS collaborated logic circuit is synthesized in the inventive method.
Figure 14C:
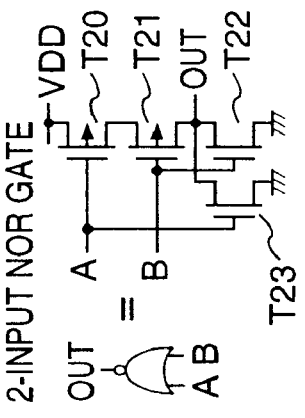
Figure 14D:
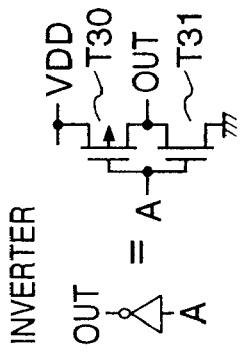
Figure 14A:
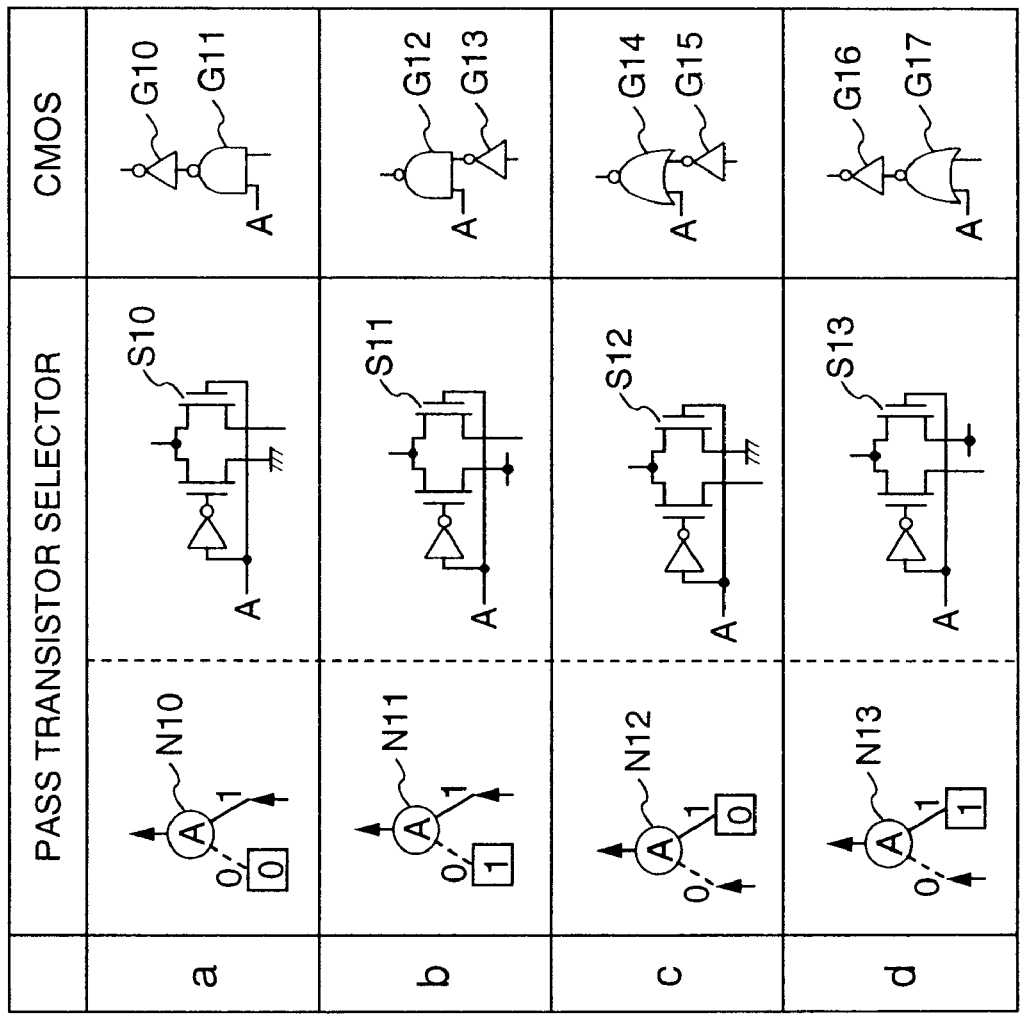

First, pass transistor selectors of the pass transistor logic circuit corresponding to conversion patterns shown by a–d in FIG. 14A are selected. The pass transistor selectors shown by a–d of FIG. 14A operate as a NAND or NOR (or AND or OR) logic with one of its two inputs being fixed to a VDD or GND potential or to logical constant "1" or "0". A process 131 converts those pass transistor selectors to CMOS gates in accordance with converting patterns of FIG. 14A. A 2-input NAND gate (FIG. 14B), a 2-input NOR gate (FIG. 14C), and an inverter (FIG. 14D) of a CMOS circuit shown by a simplified symbol in the conversion patten of FIG. 14A include transistor level circuits which include transistors T10–T13, T20–T23, and T30–T31, respectively.

As will be seen from the conversion patterns of FIG. 14A, one pass transistor selector is not necessarily converted to one CMOS gate, and an inverter for polarity adjustment is usually required. Thus, when the pass transistor selector is simply converted to a CMOS gate in accordance with a respective one of the conversion patterns of FIG. 14A, a redundant series combination of an inverter existing originally and an inverter for polarity adjustment produced by the conversion can be produced. In order to produce a pass transistor/CMOS collaborated logic circuit excellent in circuit characteristics which are area, delay time, and power consumption, the above-mentioned useless inverter is required to be removed from the logic circuit by inverter propagation. There is the possibility that by converting a pass transistor selector to a CMOS gate, a circuit in which the pass transistor selector directly drives the CMOS gate will be produced. In this case, a buffer inverter is required to be inserted into between the pass transistor selector and the CMOS gate. Although the inverter propagation and the buffer insertion are contradictory processes, a pass transistor/CMOS collaborated logic circuit excellent in circuit characteristics which are area, delay time and power consumption is produced with a buffer inverter being inserted in a required place and no redundant inverters being present, by performing the two contradictory processes simultaneously in a lump (process 132).

The area, delay time and power consumption of the circuit which has subjected to the inverter propagation and buffer insertion will next be calculated. The cost of this circuit is calculated from the values of those circuit characteristics. The cost of the circuit in which the pass transistor selector is replaced with a CMOS gate is compared with a precalculated cost of the original circuit in which no transistor selector is replaced with a CMOS gate (process 133). If the cost of the circuit in which the pass transistor selector is replaced with a CMOS gate is lower than the precalculated one of the original circuit in which no transistor selector is replaced with a CMOS gate, the former is selected whereas if not, the latter is restored. That is, that of the pass transistor selector and the CMOS gate which brings about a lower circuit cost is selected (process 134). The above processes 131–134 are performed on all the pass transistor selectors corresponding to the conversion patterns of FIG. 14A to replace with CMOS gates all the pass transistor selectors of the circuit whose circuit characteristics will thereby be improved to produce a pass transistor/CMOS collaborated logic circuit having excellent characteristics which are area, delay time and power consumption.

According to this method, it is possible to control which of the area, delay time and power consumption of the circuit should be emphasized in the circuit synthesis, by changing the definition of the cost determined from the area, delay time and power consumption. For example, if $\alpha=1$, $\beta=0$ and $\gamma=0$ are set where $\beta$ is an area priority degree, $\beta$ is a delay-time priority degree and $\gamma$ is a power-consumption priority degree in the cost defined in a block 135 of FIG. 9, a pass transistor/CMOS collaborated logic circuit is synthesized so that only the area of the logic circuit is reduced with its delay time and power consumption being not considered. If $\alpha=0$, $\beta=0$ and $\gamma=1$ are set, a pass transistor/CMOS collaborated logic circuit is synthesized which gives the highest priority to its power consumption. Of course, it is possible to synthesize a pass transistor/CMOS collaborated logic circuit so that all the three circuit characteristics are improved. If $\alpha=1$, $\beta=1$ and $\gamma=1$ are set, a pass transistor/CMOS collaborated logic circuit is synthesized in cosideration of its area, delay time and power consumption.

Figure 15:
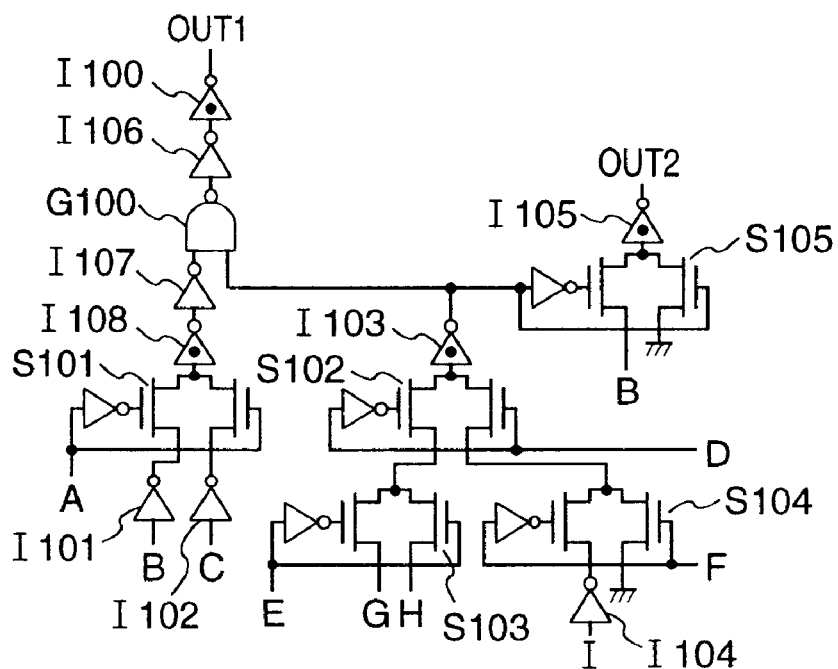
FIG. 15 is a circuit diagram of an intermediate circuit produced in a CMOS gate allocation routine of the inventive pass transistor/CMOS collaborated logic circuit synthesis program of FIG. 9.
Figure 16:
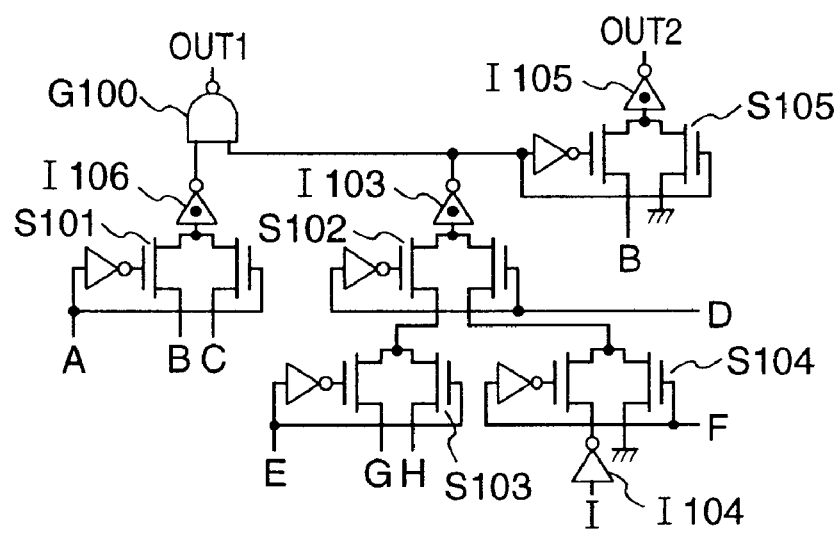
FIG. 16 is another circuit diagram of an intermediate circuit produced in the CMOS gate assigning routine of the inventive pass transistor/CMOS collaborated logic circuit synthesis program of FIG. 9.
Figure 17:
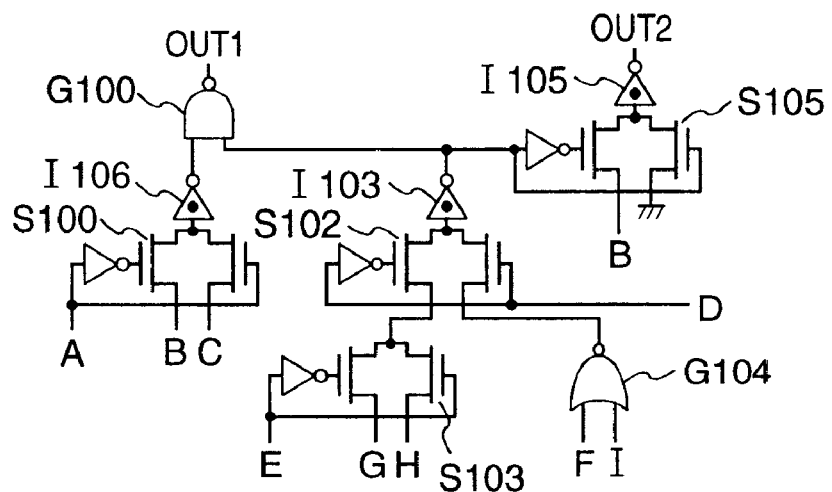
FIG. 17 is a circuit diagram of a pass transistor/CMOS collaborated logic circuit synthesized when the highest priority was given to its area (area highest-priority) in the inventive pass transistor/CMOS collaborated logic circuit synthesis program of FIG. 9.

In the present embodiment, a method of synthesizing pass transistor/CMOS collaborated logic circuit by giving the highest priority to its area ($\alpha=1$, $\beta=0$ and $\gamma=0$ are set in the cost defined at the block 135 of FIG. 9) will be described next. Since in the circuit of FIG. 13 a selector 100 corresponds to the conversion pattern a of FIG. 14A, it is converted to a CMOS gate by the process 131 to thereby produce an intermediate circuit of FIG. 15. In the intermediate circuit of FIG. 15, the pass transistor selector S101 as it is directly drives the CMOS gate G100, so that a buffer inverter I108 is inserted. In order to adjust the porality of the inverter 108, another inverter I107 is also inserted. Since this inverter I107 is a redundant one connected in series with the two orinally present inverters I101 and I102, however, it is removed in the inverter propagation process at 132. Since the inverters I100 and I106 are also redundant ones, they are removed. Thus, a pass transistor/CMOS collaborated logic circuit of FIG. 16 is obtained. The area of this circuit is 992 $\mu m^2$ according to calculation referring to the library 11, and the cost of this circuit has the same value as its area. The area and cost of the pass transistor/CMOS collaborated logic circuit in which no pass transistor selecter S100 is replaced with a CMOS gate are both 1,164 $\mu m^2$. That is, replacement of the pass transistor selector with the CMOS gate serves to reduce the cost, so that the circuit in which the pass transistor selecter S100 is replaced with a CMOS gates is employed. Since S104 and S105 of the remaining pass transistor selectors of the circuit of FIG. 16 correspond to the conversion pattern c of FIG. 14A, they are similarly converted to CMOS gates. The pass transistor selector S105 should be composed of a pass transistor selector itself because the area and cost of the desired circuit are reduced compared to a circuit which involves the replacement with a CMOS gate, so that it is not replaced with the CMOS gate. By the just-mentioned above processing, a pass transistor/CMOS collaborated logic circuit of FIG. 17 is finally synthesized.

Table 1 below shows in comparison the pass transistor/CMOS collaborated logic circuit synthesized by the present invention from the logoic function of the embodiment 2, a CMOS logic circuit, a pass transistor logic circuit, and a logic circuit in which the CMOS logic circuit is replaced with a pass transistor selector, with respect to area, delay time and power consumption.

TABLE 1

|  | CMOS (FIG. 10) | Pass-transister direct mapping (FIG. 18) | Results according to the present invention | | |
|---|---|---|---|---|---|
|  |  |  | Area priority (FIG. 17) | Delay-time priority (FIG. 19) | Power consump. (FIG. 13) |
| Area ($\mu m^2$) | 1380 (1.00) | 1984 (1.44) | 906 (0.66) | 949 (0.69) | 1164 (0.84) |
| Dalay time (ns) | 1.72 (1.00) | 2.66 (1.55) | 1.61 (0.94) | 1.39 (0.81) | 1.55 (0.90) |
| Power ($\mu$W/MHz) | 347 (1.00) | 219 (0.63) | 150 (0.43) | 183 (0.53) | 140 (0.40) |

As shown in Table 1, the pass transistor/CMOS collaborated logic circuit synthesized by giving the highest priority to its area (area priority) succeeded in the reduction of about 40% in area compared to a logic circuit (FIG. 10) composed only of CMOS gates. It succeeded also in the reduction of about 5 and 60% in delay time and power consumption, respectively. It will be seen that in comparison with a logic circuit composed only of pass transistors (FIG. 13), a desired pass transistor/CMOS collaborated logic circuit is synthesized which has a large delay time and power consumption but small area compared to the logic circuit composed only of pass transistors.

As described in the embodiment 1, the strongest point of the pass transistor selector is not a NAND or NOR logic, but a selector logic which selects any one of a plurality of signals with another signal. In the present method, a binary decision diagram is created from a given Boolean function, a logic circuit is fabricated only with pass transistors, and pass transistor selectors functioning as NAND or NOR (or AND or OR) logics are replaced with CMOS gates to reconstruct the logic circuit. By synthesizing a logic circuit in such process, pass transistor selectors are assigned to parts of a given Boolean function corresponding to the selector logic, and CMOS gates are assigned to parts of the Boolean function corresponding to other NAND or NOR (or AND or OR) logics. In this way, by employing pass transistor selectors and CMOS gates well at their respective appropriate positions in the logic circuit, a pass transistor/CMOS collaborated logic circuit is produced which has well combined advantages of the pass transistor selectors and CMOS gates.

Figure 18:
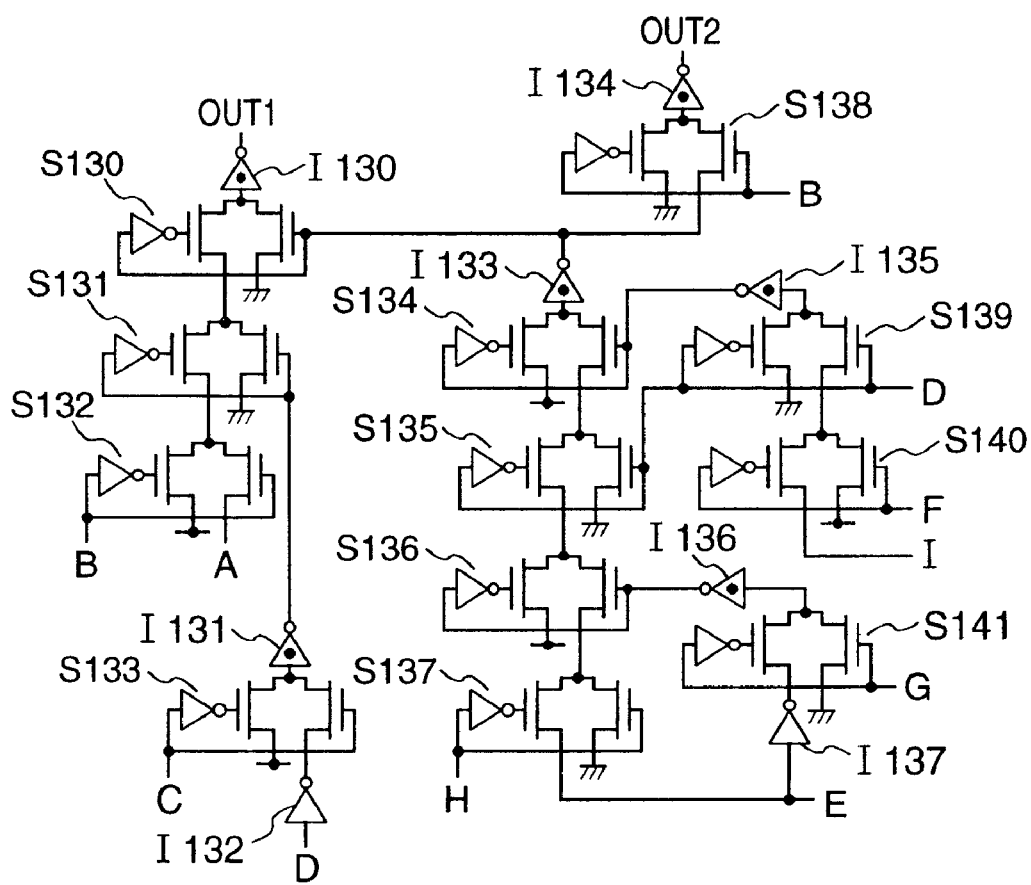
FIG. 18 is a circuit diagram of a logic circuit obtained by converting the CMOS gates of the CMOS logic circuit of FIG. 10 to pass transistor selectors.

Even when the inventive logic circuit synthesizing method is not used, a logic circuit can be produced which contains only combined pass transistors and CMOS gates. For example, a circuit which contains combined pass transistors and CMOS gates can be produced in a process completely reverse to the present process, for example, by producing a logic circuit composed only of CMOS gates, finding those of the CMOS gates which should be replaced with pass transistor selectors, and converting those CMOS gates to pass transistor selectors. However, even when a given Boolean function includes selector logic portions suitable for pass transistor selectors, it is difficult to find circuit portions corresponding to the selector logic portions since all logics each includes combined NAND and NOR (or AND and OR) logics in the CMOS logic circuit. Actually, when a CMOS logic circuit (FIG. 10) synthesized from the Boolean function of the present embodiment is replaced with a pass transistor selector, a pass transistor circuit shown in FIG. 18 is obtained. In this circuit, all the pass transistor selectors are used as NAND or NOR (or AND or OR) logic which is not suitable for the pass transistor selector with one of two inputs to each of all the pass transistor selectors being fixed to VDD or GND potential. There are no pass transistor selectors used as a selector logic. Thus, as shown in Table 1, the circuit of FIG. 18 is inferior to any one of the logic circuit composed only of CMOS gates (FIG. 13) and the logic circuit composed only of pass transistors (FIG. 13) in all circuit characteristics which are area, delay time and power consumption. As just mentioned above, it is difficult to produce from CMOS logic circuits a logic circuit which contains well combined advantages of pass transistors and CMOS gates. It will be seen that in the worst case a circuit would be produced which is inferior in performance to any one of a logic circuit composed only of CMOS gates and a logic circuit composed only of pass transistors, as in the circuit of FIG. 18.

As will be seen from the above, it is impossible to combine well the respective advantages of pass transistor selectors and CMOS gates only by combining the pass transistor selectors and CMOS gates. In the worst case, an inferior-performance logic circuit would be produced which includes only combined faults of the pass transistor selectors and CMOS gates. In other words, a desired pass transistor/CMOS collaborated logic circuit is not synthesized which includes well combined respective advantages of pass transistor selectors and CMOS gates circuit until the logic circuit is synthesized in the illustrated steps of the present process.

Modification of Embodiment 2

While in the embodiment 2 the pass transistor selector fabricated only with n-channel field effect transistors was illustrated, a pass transistor/CMOS collaborated logic circuit may include pass transistor selectors of p- and n-channel transistors (for example, transistors T200–T203, and an inverter I200) in the present method in exactly the same manner in which the embodiment 2 was produced. This applies quite equally to the following embodiments.

Embodiment 3

Figure 9:
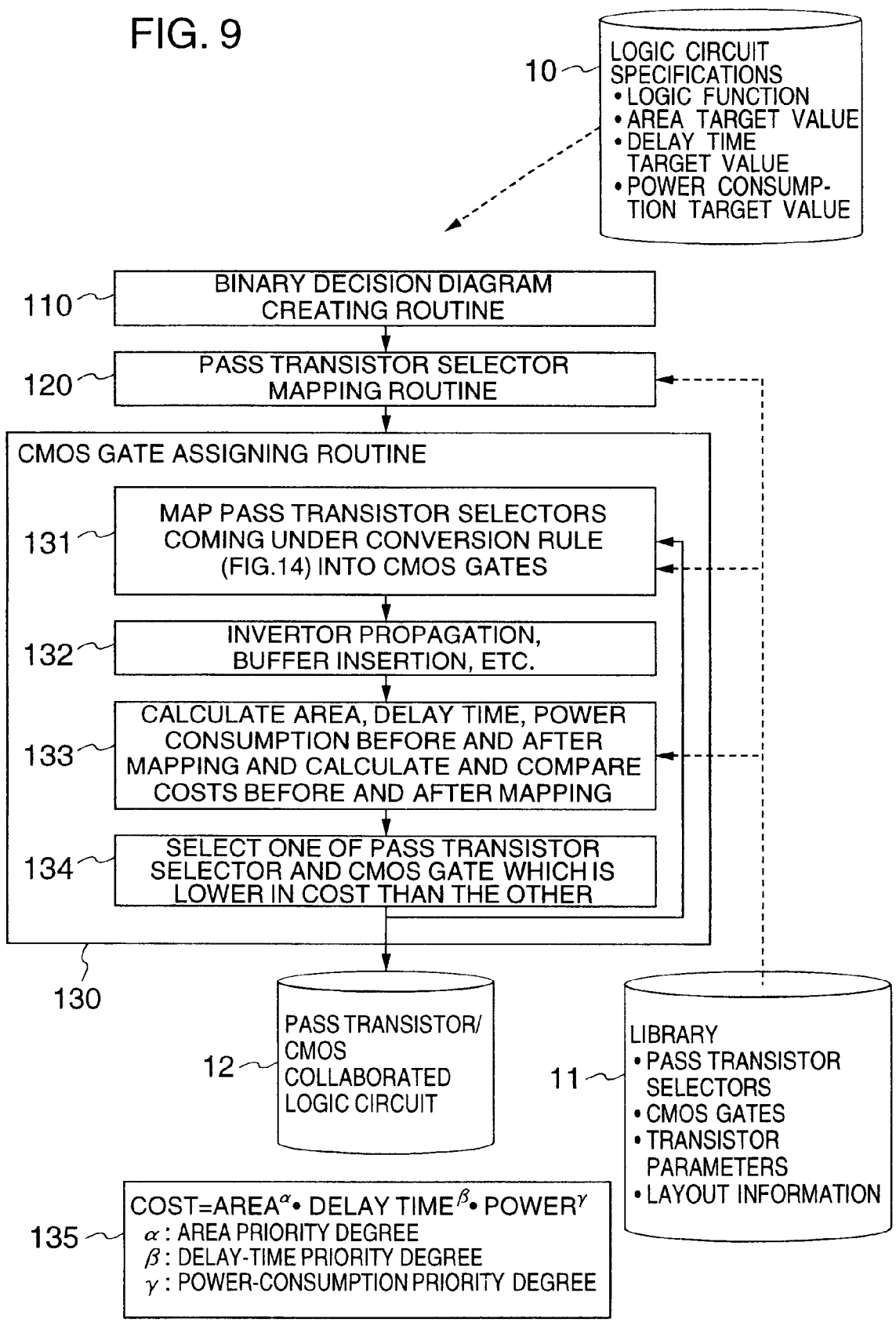
FIG. 9 is a flow chart of a pass transistor/CMOS collaborated logic circuit synthesis program as the embodiment 2.
Figure 13:
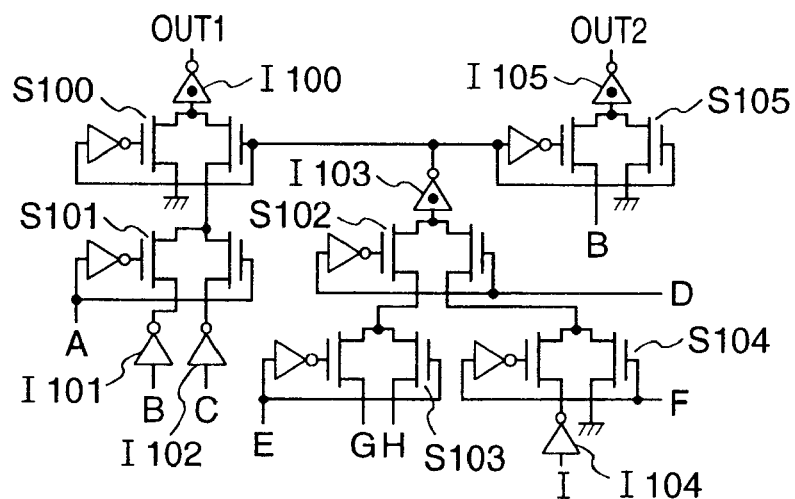
FIG. 13 is a circuit diagram of a pass transistor produced on the basis of the multi-level binary decision diagram of FIG. 11 in the pass transistor mapping routine of the inventive pass transistor/MOS collaborated logic circuit synthesis program of FIG. 9.

In the present embodiment, a pass transistor/CMOS collaborated logic circuit is illustrated which is synthesized by giving the highest priority to its delay time ($\alpha=0$, $\beta=1$, and $\gamma=0$ are set in the cost of the block 135 of FIG. 9) unlike the embodiment 2, using the same Boolean function as the embodiment 2 as an example. As in the embodiment 2, a binary decision diagram is created in the binary decision diagram creating routine 110, and a pass transistor logic circuit of FIG. 13 is created in the pass transistor mapping routine 120. In the pass transistor logic circuit of FIG. 13, a pass transistor selector S100 is selected and converted to a CMOS gate in the process 131, Then, in the process 132, a buffer inverter is inserted at the output of the selector S101, and a redundant inverter is removed to provide an intermediate circuit of FIG. 16. In the process 135, the delay time of the circuit is calculated and not its area, unlike the embodiment 2, and the value of the delay time becomes the cost of this circuit. The delay time of the circuit in which the pass transistor selectors are not yet replaced with CMOS gates (FIG. 13) is the one required for a signal to pass through a path which includes an input F, selector S104, selector S102, buffer inverter I103, inverter of a selector S100, selector S100 and buffer inverter I100. A corresponding path in the circuit in which the pass transistor selectors are replaced with CMOS gates (FIG. 16) is shortened to a path which includes an input F, selector S104, selector S102, buffer inverter I103, and CMOS gate G100, so that the delay time is greatly reduced. Thus, the circuit in which the pass transistor selectors are replaced with CMOS gates is reduced in cost compared to the circuit in which the pass transistor selectors are not yet replaced with CMOS gates, so that the former circuit is selected in the process 134.

As described above in the "Problem to be Solved by the Invention", a circuit is produced in which a pass transistor selector is connected via a buffer inverter to a control input of a subsequent pass transistor selector in a logic circuit composed only of pass transistors constructed on the basis of a multi-level binary decision diagram (S102, I103, an inverter of S100, S100 in FIG. 13). In this case, since the buffer inverter is connected in series with the inverter of the subsequent pass transistor selector, the delay time would inevitably increase. As described in the embodiment 1, however, if the subsequent pass transistor selectors are well replaced with CMOS gates as already described in the embodiment 1, the inverters of the pass transistor selectors having a large delay time can be omitted to thereby produce a logic circuit having a reduced delay time. Generally, by replacing a logic circuit composed only of pass transistors with a pass transistor/CMOS collaborated logic circuit, the delay time of the resulting circuit is reduced.

Figure 19:
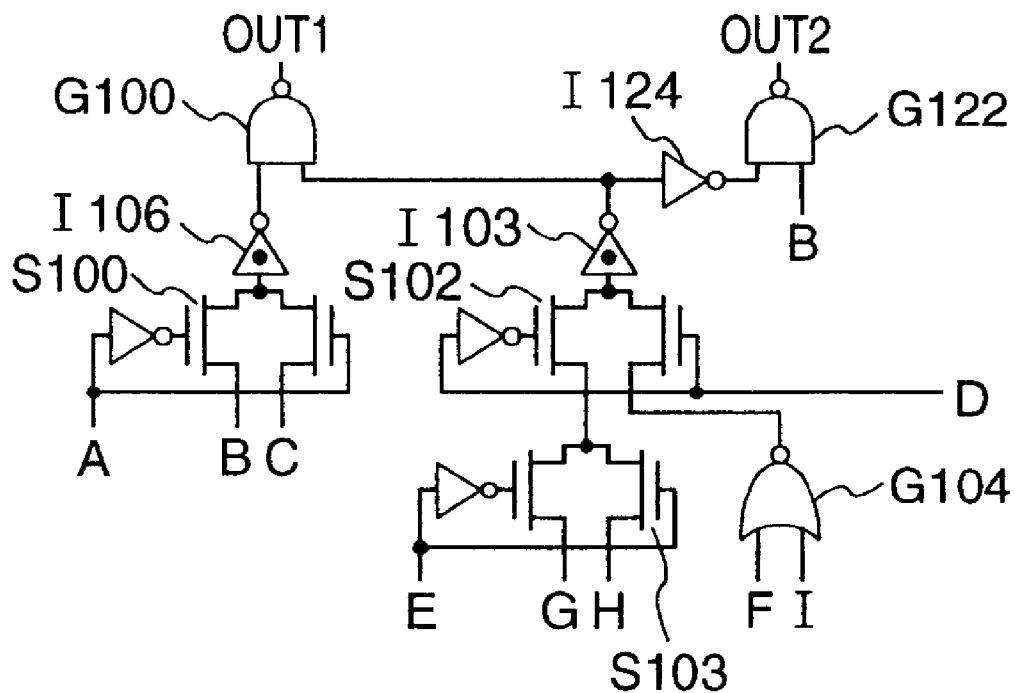
FIG. 19 is a circuit diagram of a pass transistor/CMOS collaborated logic circuit synthesized when the highest priority was given to delay time (delay-time highest priority) in the inventive pass transistor/CMOS collaborated logic circuit synthesis program of FIG. 9.
Figure 20:
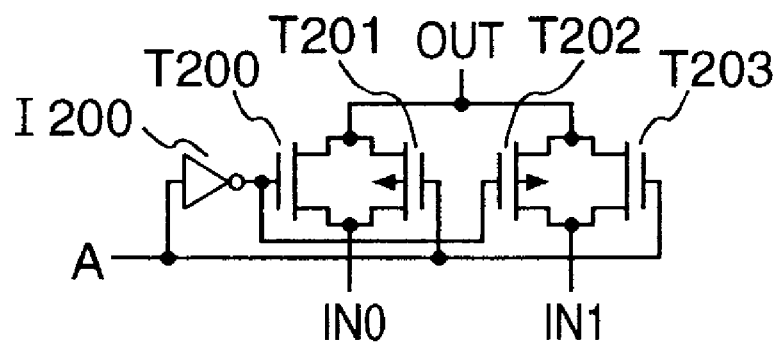
FIG. 20 is a circuit diagram of a pass transistor selector composed of both p- and n-channel transistors.

Among the remaining pass transistor selectors, S104 and S105 correspond to the conversion patterns of FIG. 14A. While only S104 was replaced with a CMOS gate in the embodiment 2 in which the highest priority was given to the area of the logic circuit, S105 is also converted to a CMOS gate in the present embodiment in which the highest priority is given to its delay time because the conversion of the selector S105 to the CMOS gate serves to remove an inverter having a large delay time in the selector S105 to thereby reduce the delay time further, as in the case of S100. By those operations, a pass transistor/CMOS collaborated logic circuit of FIG. 19 is obtained finally. By synthesizing the pass transistor/CMOS collaborated logic circuit in the present process also in the present embodiment, as shown in Table 1, this circuit succeeded in the reduction of about 20% of the delay time compared to the logic circuit composed only of CMOS gates (FIG. 10). That circuit also succeeded in the reduction of about 10% of the delay time compared to the logic circuit composed only of pass transistors (FIG. 13).

Embodiment 4

In the present embodiment, a method of synthesizing a pass transistor/CMOS collaborated logic circuit 12 in which the highest priority is given to its power consumption (with $\alpha=0$, $\beta=1$, and $\gamma=0$ being set in the cost of the block 135 of FIG. 9), unlike the embodiments 2 and 3, will be described, using as an example the same Boolean function as that used in the embodiments 2 and 3. As in the embodiments 2 and 3, a binary decision diagram is created in the binary decision diagram creating routine, and a pass transistor logic circuit of FIG. 13 is produced in a pass transistor selector mapping routine 120. In the pass transistor logic circuit of FIG. 13, a selector S100 is first selected, and by the processes 131 and 132, an intermediate circuit of FIG. 16 is obtained. In the next process 133, the power consumption of the circuit is calculated unlike the embodiments 2 and 3, and the value of the power consumption becomes the cost of the circuit. According to calculation by referring to the library 11, the power consumption of the pass transistor/CMOS collaborated logic circuit of FIG. 16 is 143 $\mu$W/MHz. Since the power consumption of the circuit in which the pass transistors are not yet converted to CMOS gates (FIG. 13) is 140 $\mu$W/MHz, the composition of a logic circuit with pass transistor selectors serves to reduce its cost unlike the embodiments 2 and 3. That is, in the process 134, the circuit composed of pass transistor selectors is selected and not the circuit in which the pass transistor selectors are replaced with CMOS gates. The remaining pass transistor selectors corresponding to the conversion pattern of FIG. 14A are S104 and S105, and the circuit where the pass transistors S104 and S105 are composed of pass transistor selectors is low in power consumption and cost compared to a circuit where the pass transistor selectors S104 and S105 are replaced with CMOS gates. Thus, in the present embodiment which gives the highest priority to its power consumption, the pass transistor logic circuit of FIG. 13 is used as it is with their pass transistor selectors being not at all replaced with CMOS gates.

The reason for this is that as described about the results of comparison between the pass transistor selector and CMOS gate of FIG. 4A, the power consumption of the pass transistor selector is greatly small compared to that of the CMOS gate (the power consumption of the former is not more than half of that of the latter). This is because in the pass transistor selector, the selector section which occupies the great majority of the selector circuit is composed only of n-channel field effect transistors or reduces the number of p-channel field effect transistors having lesser performance than the pass transistor selector to suppress the total width of the gates of the transistors in the pass transistor selector circuit to thereby reduce the power consumption without deteriorating the performance of the selector.

Embodiment 5

Figure 21:
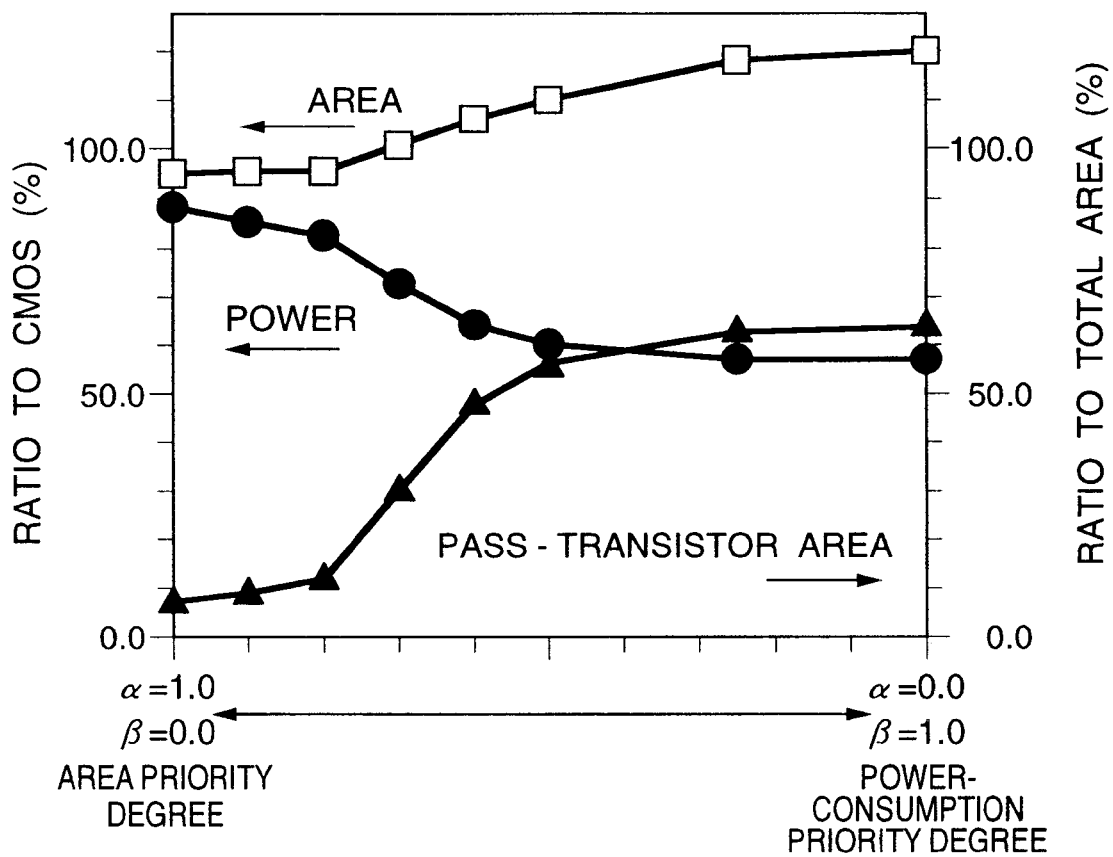
FIG. 21 shows results obtained when the highest priority is changed from the area highest priority to the delay-time highest priority in the cost of the pass transistor/CMOS collaborated logic circuit.

In the method of synthesizing the inventive pass transistor/CMOS collaborated logic circuit, pass transistor selectors operating as a NAND or NOR (or AND and/or OR) logic and considered to improve the circuit performance when converted to CMOS gates are converted to the CMOS gates. It is actually determined on the basis of calculation of the cost defined from the area, delay time and power consumption of the circuit which will be obtained when the pass transistor selectors are converted to CMOS gates whether the pass transistor selectors should actually be converted to the CMOS gates. Therefore, as will be seen from the embodiments 2–4, according to the present method, the various characteristics of the circuit to be synthesized are flexibly controlled by changing the cost defined by the area, delay time and power consumption of a pass transistor/CMOS collaborated logic circuit to be synthesized to thereby change the ratio in number of the pass transistor selectors to the CMOS gates. For example, FIG. 21 shows the results of having synthesized pass transistor/CMOS collaborated logic circuits by changing between 0 and 1 its area priority degree $\alpha$ and power-consumption priority degree $\gamma$ in the cost shown by the block 135 in FIG. 9 on the basis of an illustrative Boolean function of a larger scale (of about 1,000 gates calculated in terms of CMOS gates) than the embodiments 2–4 to thereby change the priority degree from the area highest priority to the power-consumption highest priority. As will be seen from the results of FIG. 21, as the priority degree of the power consumption increases, the ratio in number of pass transistors suitable for reducing the power consumption increases to thereby synthesize a pass transistor/CMOS collaborated logic circuit which gives the highest priority to its power consumption.

As just described above, by controlling the ratio in number of pass transistor selectors to CMOS gates in a pass transistor/CMOS collaborated logic circuit synthesized in the present method, the characteristics of the circuit to be synthesized are easily controlled. It was first clarified that the three circuit characteristics, i.e., area, delay time and power consumption of a pass transistor/CMOS collaborated logic circuit constituted for an actual large-scale logic balanced best when the area percentage of the pass transistor circuit was 10–60% of the whole circuit area. This was not clear until the above result was obtained.

Figure 22:
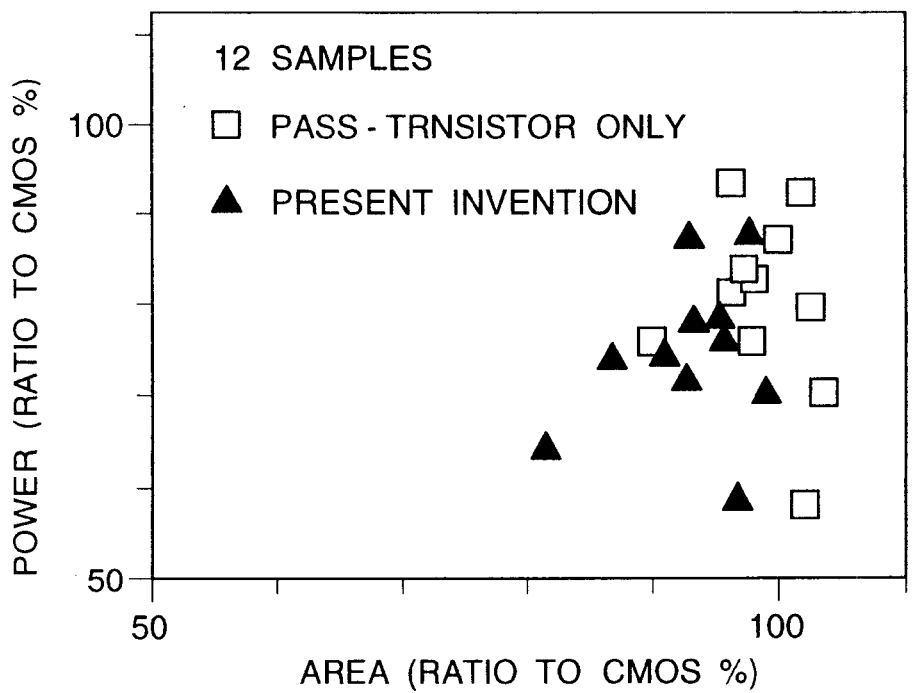
FIG. 22 shows in comparison logic circuits synthesized in the inventive pass transistor/CMOS collaborated logic circuit synthesis program, and CMOS logic circuits and pass transistor logic circuits synthesized in the conventional method, with respect to area and power consumption, for twelve different logics.

Only when the circuit characteristics such as the area, delay time and power consumption of the circuit actually are improved, the pass transitor selectors are converted to CMOS gates in the present method. Thus, in the present process, a pass transistor/CMOS collaborated logic circuit excellent in circuit characteristic is always produced compared to a logic circuit composed only of pass transistors or a logic circuit composed only of CMOS gates for any Boolean function. For example, FIG. 22 shows the results of comparison of the pass transistor/CMOS collaborated logic circuits synthesized in the present process and the logic circuits composed only of pass transistors synthesized in the conventional method, relative to a logic circuit composed only of CMOS gates, for 12 kinds of logics (1,000–10,000 gates calculated in terms of CMOS gates) of a larger scale than the logic of FIG. 21. As will be seen from this result, according to the present process, pass transistor/CMOS collaborated logic circuit are synthesized which are always excellent in both area and power consumption compared to the conventional logic circuits composed only of pass transistors and the conventional logic circuits composed only of CMOS gates, for any logic.

Embodiment 6

Figure 23:
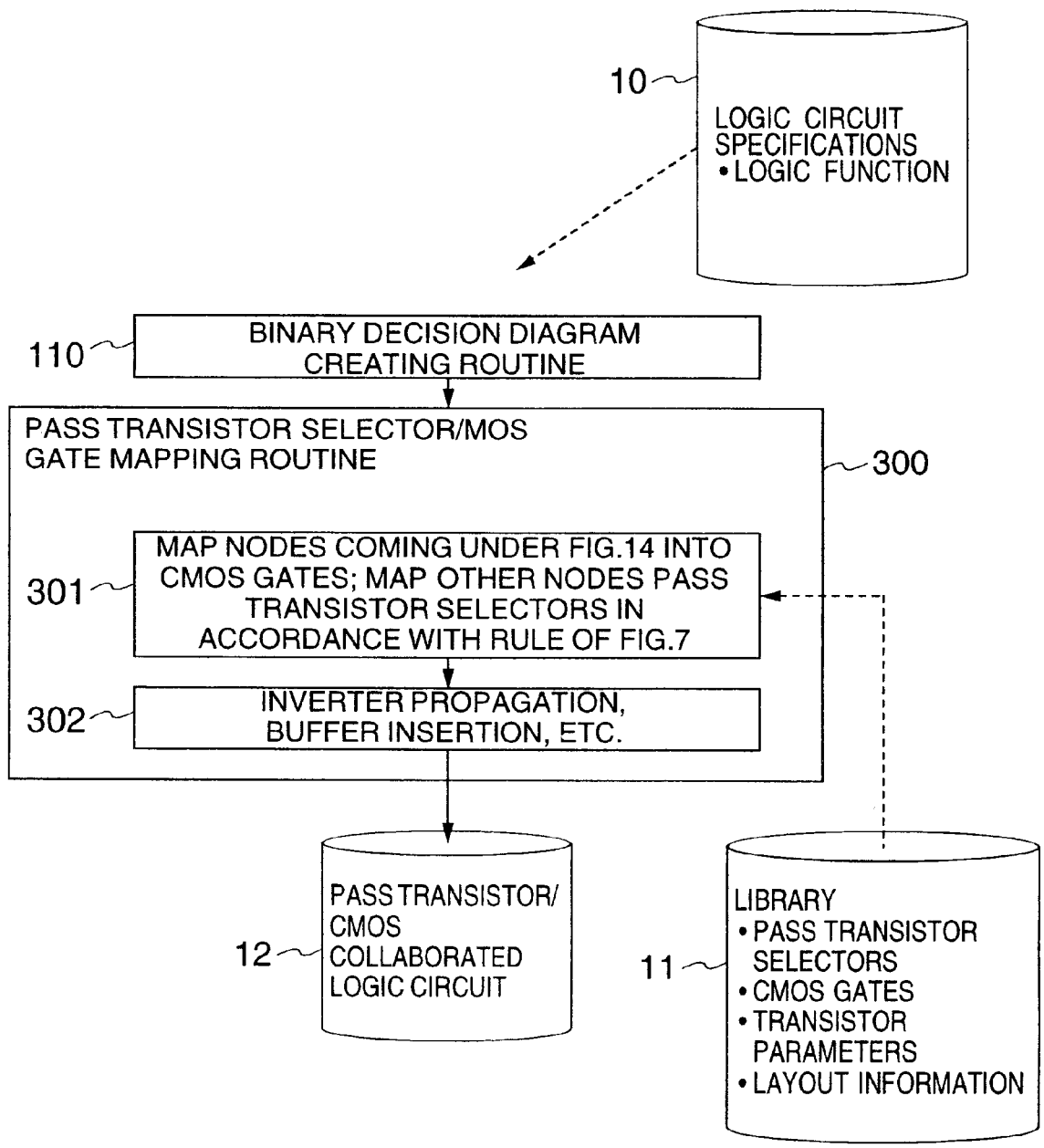
FIG. 23 is a flow chart of a pass transistor/CMOS collaborated logic circuit synthesis program as an embodiment 6 of the present invention.
Figure 24:
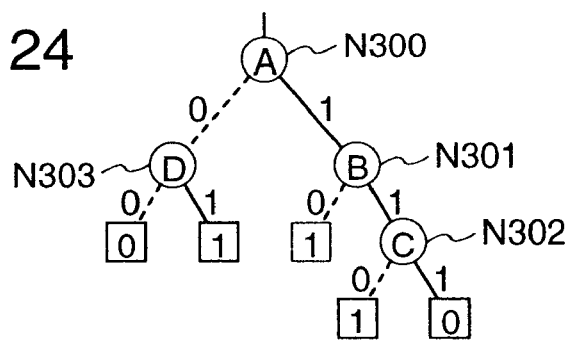
FIG. 24 illustrates a binary decision diagram produced in a binary decision diagram produced in the inventive pass transistor/CMOS collaborated logic circuit synthesis program of FIG. 23.
Figure 25:
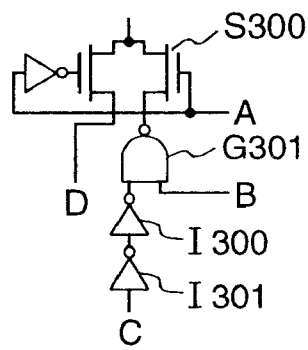
FIG. 25 is a circuit diagram of an intermediate circuit produced in a pass transistor selector/CMOS gate mapping routine of the inventive pass transistor/CMOS collaborated logic circuit synthesis program of FIG. 23.
Figure 26:
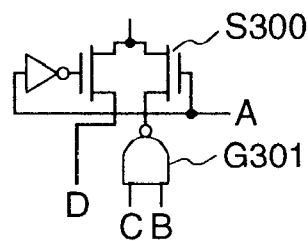
FIG. 26 is a circuit diagram of a pass transistor/CMOS collaborated logic circuit synthesized by the inventive pass transistor/CMOS collaborated logic circuit synthesis program of FIG. 23.

In the above embodiments, the process of synthesizing a pass transistor/CMOS collaborated logic circuit in accordance with the program of FIG. 9 was illustrated. In the present embodiment, a method of synthesizing a pass transistor/CMOS collaborated logic circuit in accordance with the program of FIG. 23 will next be illustrated. Like the above embodiments 2–5, a binary decision diagram in first created in the binary decision diagram creating routine 110. The present embodiment is different from the embodiments 2–5 in that a pass transistor/CMOS collaborated logic circuit is directly synthesized from the binary decision diagram in a pass transistor selector/CMOS gate mapping routine 300 without becoming an intermediate pass transistor logic circuit. The pass transistor selector/CMOS gate mapping routine 300 will be described next, using a binary decision diagram of FIG. 24. Since a node N301 corresponds to b of FIG. 14A, it is mapped to a CMOS gate in accordance with a conversion pattern of FIG. 14A in a process 301 (G301, I300 of FIG. 25). Other nodes N300, N302, N303 are mapped to pass transistor selectors and an inverter (S300, I301 of FIG. 25) in accordance with the mapping rule of FIG. 12. In this way, an intermediate circuit of FIG. 25 is produced, in which since the inverters I300 and I301 are redundant ones, they are removed in a process 302, and a circuit of FIG. 26 is finally synthesized.

Figure 27:
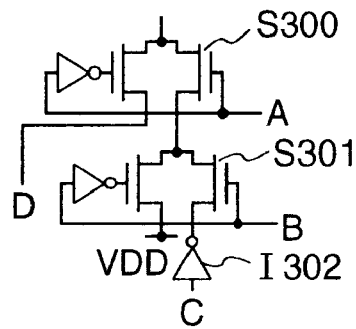
FIG. 27 is a circuit diagram of a pass transistor logic circuit synthesized from the binary decision diagram of FIG. 24.

In the pass transistor/CMOS collaborated logic circuit synthesis program (FIG. 9) of the embodiments 2–5, a pass transistor logic circuit is once produced, its pass transistor selector operating as a NAND or NOR (or AND or OR) logic is converted to a CMOS gate if the cost defined from the circuit characteristics, i,e., area, delay time and power consumption, of a prospective pass transistor/CMOS collaborated circuit is calculated, and the calculated cost is reduced compared to the cost of the original logic circuit in which the pass transistor selector is not converted to the CMOS gate. Therefore, in any case, it is ensured that a logic circuit excellent in circuit characteristic is synthesized. However, each time such logic circuit is synthesized, its area, delay time and power consumption are required to be calculated. Thus, there is the shortcoming that it takes some time for the circuit synthesis. As will be seen in FIG. 4, in most cases, the characteristics of a circuit to be synthesized is improved by replacing a pass transistor selector operating as a NAND or NOR (AND or OR) logic with a CMOS gate. Therefore, even when a pass transistor/CMOS collaborated logic circuit is produced directly from a binary decision diagram without calculating the cost as in the present embodiment, it is expected that the logic circuit is generally excellent in circuit characteristic. When a pass transistor logic circuit is actually synthesized from a binary decision diagram of FIG. 24, the circuit of FIG. 27 is obtained. It will be seen that the pass trasistor/CMOS collaborated logic circuit (FIG. 25) synthesized by the inventive method contains transistors less in number than the circuit of FIG. 27 and is hence excellent compared to the same. As described above, also, by the present method, a pass transistor/CMOS collaborated logic circuit is synthesized which contains well combined advantages of pass transistor selectors and CMOS gates.

INDUSTRIAL APPLICABILITY

As will be seen from the above illustrated embodiments, according to the present invention, by combining well both the advantages of a pass transistor circuit and a CMOS circuit whatever logic the given logic circuit specifications may indicate, a pass transistor/CMOS collaborated logic circuit is synthesized which is excellent in circuit characteristics which are area, delay time and power consumption compared to the conventional logic circuit composed only of CMOS gates and the conventional logic circuit composed only of pass transistors.

By adjusting the cost defined by the area, delay time and power consumption of the circuit, the ratio in number of the pass transistor selectors to the MOS gates is changed to thereby control flexibly the circuit characteristics, which are area, delay time and power consumption, of the pass transistor/CMOS collaborated logic circuit to be synthesized.

What is claimed is:

1. A semiconductor integrated circuit device comprising:
   a pass transistor circuit including first and second field-effect transistors, said first field-effect transistor having a source-drain path connected between a first node and a second node, and said second field-effect transistor having a source-drain path connected between a third node and said second node; and
   a multi-input CMOS logic circuit having first and second input nodes, first and second p-channel transistors and first and second n-channel transistors for producing a control signal, said first p-channel transistor being connected to said first n-channel transistor serially, said second p-channel transistor being connected to said second n-channel transistor serially, said first input node being connected to gates of said first p-channel transistor and said first n-channel transistor and second input node being connected to gates of said second p-channel transistor and said second n-channel transistor;

wherein said control signal is applied to a gate of said first field-effect transistor and an inverted version of said control signal is applied to a gate of said second field-effect transistor.

2. A semiconductor integrated circuit device according to claim 1, wherein said inverted version of said control signal is generated by an inverter circuit.

3. A semiconductor integrated circuit device according to claim 1, further comprising a pass transistor cell including said pass transistor circuit and a CMOS cell including said multi-input CMOS logic circuit, said pass transistor cell and said CMOS cell being arranged along a power supply line, said pass transistor cell having a width as viewed in a direction perpendicular to said power supply line equal to a width of said CMOS cell as viewed in the direction perpendicular to said power supply line.

4. A semiconductor integrated circuit device comprising:

a pass transistor circuit including first and second field-effect transistors, said first field-effect transistor having a source-drain path connected between a first node and a second node, and said second field-effect transistor having a source-drain path connected between a third node and said second node; and a multi-input CMOS logic circuit having first and second input nodes, first and second p-channel transistors and first and second n-channel transistors ,said first p-channel transistor being connected to said first n-channel transistor serially, said second p-channel transistor being connected to said second n-channel transistor serially, and first input node being connected to gates of said first p-channel transistor and said first n-channel transistor and said second input node being connected to gates of said second p-channel transistor and said second n-channel transistor;

wherein an output of said multi-input CMOS logic circuit is applied to said first node, a control signal is applied to a gate of said first field-effect transistor, and an inverted version of said control signal is applied to a gate of said second field-effect transistor.

5. A semiconductor integrated circuit device according to claim 4, wherein said inverted version of said control signal is generated by an inverter circuit.

6. A semiconductor integrated circuit device according to claim 4, further comprising a pass transistor cell including said pass transistor circuit and a CMOS cell including said multi-input CMOS logic circuit, said pass transistor cell having a width as viewed in a direction perpendicular to said power supply line equal to a width of said CMOS cell as viewed in the direction perpendicular to said power supply line.

7. A semiconductor integrated circuit device comprising:

a pass transistor circuit including first and second field-effect transistors, said first field-effect transistor having a source-drain path connected between a first node and a second node, and said second field-effect transistor having a source-drain path connected between a third node and said second node;

an inverter circuit having an input connected to said second node; and a multi-input CMOS logic circuit having first and second input nodes, first and second p-channel transistors and first and second n-channel transistors, said first p-channel transistor being connected to said first n-channel transistor serially, said second p-channel transistor being connected to said second n-channel transistor serially, said first input node being connected to gates of said first p-channel transistor and said first n-channel transistor and said second input node being connected to gates of said second p-channel transistor and said second n-channel transistor;

wherein an output of said inverter circuit is applied to one of said first and second input nodes of said multi-input CMOS logic circuit, a control signal is applied to a gate of said first field-effect transistor, and an inverted version of said control signal is applied to a gate of said second field-effect transistor.

8. A semiconductor integrated circuit device according to claim 7, wherein said inverted version of said control signal is generated by said inverter circuit.

9. A semiconductor integrated circuit device according to claim 7, further comprising a pass transistor cell including said pass transistor circuit and a CMOS cell including said multi-input CMOS logic circuit, said pass transistor cell and said CMOS cell being arranged along a power supply line, said pass transistor cell having a width as viewed in a direction perpendicular to said power supply line equal to a width of said CMOS cell as viewed in the direction perpendicular to said power supply line.

* * * * *